(12) United States Patent
Abbott et al.

(10) Patent No.: US 8,552,819 B2
(45) Date of Patent: Oct. 8, 2013

(54) HIGH COUPLING, LOW LOSS SAW FILTER AND ASSOCIATED METHOD

(75) Inventors: Benjamin P. Abbott, Maitland, FL (US); Alan Chen, Windermere, FL (US); Taeho Kook, Orlando, FL (US); Kurt Steiner, Orlando, FL (US); Robert Aigner, Ocoee, FL (US); Suzanne Combe, Longwood, FL (US); Timothy Daniel, Orlando, FL (US); Natalya F. Naumenko, Moscow (RU); Julien Gratier, Newton, MA (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 13/282,371

(22) Filed: Oct. 26, 2011

(65) Prior Publication Data

US 2013/0106535 A1    May 2, 2013

(51) Int. Cl.
*H03H 9/00* (2006.01)
(52) U.S. Cl.
USPC .......................................... 333/195; 333/133
(58) Field of Classification Search
USPC ..................... 333/133, 193, 194, 195
See application file for complete search history.

(56) References Cited

U.S. PATENT DOCUMENTS

| | | | | |
|---|---|---|---|---|
| 5,313,177 A | * | 5/1994 | Hickernell et al. | 333/193 |
| 5,389,806 A | * | 2/1995 | Hickernell et al. | 257/239 |
| 5,682,126 A | * | 10/1997 | Plesski et al. | 333/193 |
| 7,339,304 B2 | | 3/2008 | Kadota | |
| 7,345,400 B2 | | 3/2008 | Nakao | |
| 7,355,319 B2 | | 4/2008 | Kando | |
| 7,411,334 B2 | | 8/2008 | Nishiyama | |
| 2007/0284965 A1 | | 12/2007 | Kadota | |
| 2008/0160178 A1 | | 7/2008 | Nishiyama | |

OTHER PUBLICATIONS

Nalimenko et al., "Analysis of Highly Piezoelectric Non-Leaky SAW Propagating in Rotated Y-Cuts of Lithium Niobate with Thick Metal Films of Gratings," Proc. 2006, IEEE Ultrasonics Symposium, Vancouver, B.C, Canada; Oct. 4-6, 2006.
Omori, et al., "Low-Loss and Extremely-Wideband SAW Filters on a Cu-Grating/Rotated-YX-LiNbO3 Structure," Third International Symposium on Acoustic Wave Devices for Future Mobile Communication Systems, pp. 157-162 2007.
Kadota, et al.; "Small SAW Duplexer for W-CDMA Full-Band with Good Temperature Characteristics," Third International Symposium on Acoustic Wave Devices for Future Mobile Commumcation Systems, pp. 145-150, 2007.
Takayama, et al; "Advancement of SAW Duplexer by using SI02," Third International Symposium on Acoustic Wave Devices for Future Mobile Communication Systems, pp. 139-144; 2007.
Nakamura, et al.; "Small-sized SAW Duplexer on Non-flat SiO2/Al/ LiNb03 Structure for UMTS Band I System," Microwave Symposium Digest (MTT), 2010 IEEE MIT-S International, pp. 144-1467; 2010.

\* cited by examiner

*Primary Examiner* — Dean O Takaoka
(74) *Attorney, Agent, or Firm* — Schwabe Williamson & Wyatt

(57) ABSTRACT

Disclosed embodiments include a surface acoustic wave device having electrode period, electrode width, and/or ratio of electrode width to electrode period varied in a prescribed manner.

16 Claims, 31 Drawing Sheets

HIGH COUPLING, LOW LOSS SAW FILTER AND ASSOCIATED METHOD

FIELD OF INVENTION

The present invention generally relates to surface acoustic wave (SAW) devices and more particularly to SAW devices having a strong electromechanical coupling, low spurious responses, and a desired frequency-temperature characteristic for application in radio frequency (RF) filtering for wireless communications.

BACKGROUND OF THE INVENTION

SAW devices (which may also be referred to as "SAW filters") are successfully used in wireless communication systems as a result of their small size and low insertion loss provided by resonator-type structures, built on piezoelectric substrates with high electromechanical coupling factor. Such devices commonly utilize low-attenuated quasi-bulk leaky surface acoustic waves (LSAW) characterized by a high electromechanical coupling factor. Such waves are known to exist in two piezoelectric crystals belonging to the same 3m symmetry class. The known crystals are lithium tantalate, LiTaO3 (LT), and lithium niobate, LiNbO3 (LN).

Recently, devices fabricated using non-leaky quasi-shear horizontal wave devices have been reported. The suppression of the leakage effect results when the surface on which the acoustic wave propagates is sufficiently loaded with, e.g., electrodes and/or dielectric overcoat, so as to slow the wave velocity such that its value is less than that of the slow quasi-shear bulk wave propagating in the same direction.

Known SAW devices include heavy metal electrodes, deposited on a Y-rotated, X-propagating lithium niobate (YX-LN) substrate, and buried beneath a dielectric overcoat with a positive temperature coefficient of frequency (TCF). These devices may suffer from challenges that are not found with respect to devices fabricated on orientations of Y-rotated, X-propagating lithium tantalate (YX-LT) substrates. For example, a second acoustic wave mode is found that propagates on the surface of YX-LN substrates that can produce significant spurious responses in the filter's passband.

The performance characteristics of a conventional SAW device may depend predominately upon its electromechanical coupling factor, the attenuation of propagation, the TCF, and the absence of spurious acoustic wave modes. In YX-LN substrates, two SAW modes can propagate with different velocities and different electromechanical coupling coefficients. In a SAW device utilizing the SAW mode with higher coupling, the SAW mode with lower coupling produces spurious response. The performance of SAW devices may, therefore, depend upon the degree by which the spurious response is suppressed. Hereinafter, for convenience of description, high-coupling mode may be referred to as the "desired mode," and the low-coupling mode may be referred to as the "spurious mode."

Polarizations of the two SAW modes may depend on a substrate's rotation angle, mechanical load (which may depend on characteristics of electrodes on surface of substrate), and electrical boundary condition. The polarization components may generally include a longitudinal (L) component, a shear horizontal (SH) component, and a shear vertical (SV) component. A contribution of the SH-component or a combination of the L and SV components may vanish for certain rotation angles, which means that corresponding combination of the L and SV components or the SH component can propagate in such selected orientations. This may complicate use of polarization to distinguish between the two SAW modes for arbitrary rotation angles and electrode thicknesses (or masses).

Thus, for an arbitrary rotation angle and electrode thickness (or mass) it may not be possible to distinguish between these two SAW modes by examining their polarizations. Instead, their propagation velocities may be used. Alternatively, the SAW mode with a substantially greater coupling factor may be qualified as the "desired SAW mode" and the weaker SAW mode as the "spurious SAW mode".

For an unloaded surface, i.e., a surface without electrodes disposed thereon, one of the two SAW modes propagating in a YX-LN substrate will be slower than a slow shear bulk wave propagating in the same substrate, independent of substrate rotation angle. A contribution of an SH-component into polarization of this relatively slow-moving SAW mode may be small, for any propagation angle, when the surface is unloaded. This relatively slow-moving SAW mode, having a horizontal shear component that is small as compared to its vertical shear and longitudinal components, may sometimes be referred to as a Rayleigh-type wave.

The velocity of the relatively fast-moving SAW mode lies between that of the slow shear and fast shear bulk waves, when the surface is unloaded, thus making this wave leaky. It becomes 'non-leaky', when the surface is sufficiently loaded. The relatively fast-moving SAW mode may sometimes be referred to as a Love-type wave. A Love-type wave may include a relatively greater SH component, as compared to a Rayleigh-type wave, though it is not SH-polarized in general.

While extensive efforts have been made to improve performance of SAW devices, there remains a need for SAW devices to simultaneously exhibit strong electromechanical coupling, low spurious responses, and desired frequency-temperature characteristic for application in radio frequency (RF) filtering for wireless communications.

BRIEF DESCRIPTION OF THE DRAWINGS

Other features and advantages of the present invention will become more apparent from the following detailed description of embodiments herein disclosed by way of example with reference to the attached drawings.

equal to 0.10 and dielectric overcoat thickness (h_do) divided by period (p) equal to 0.60 in accordance with some embodiments.

Figure 8:
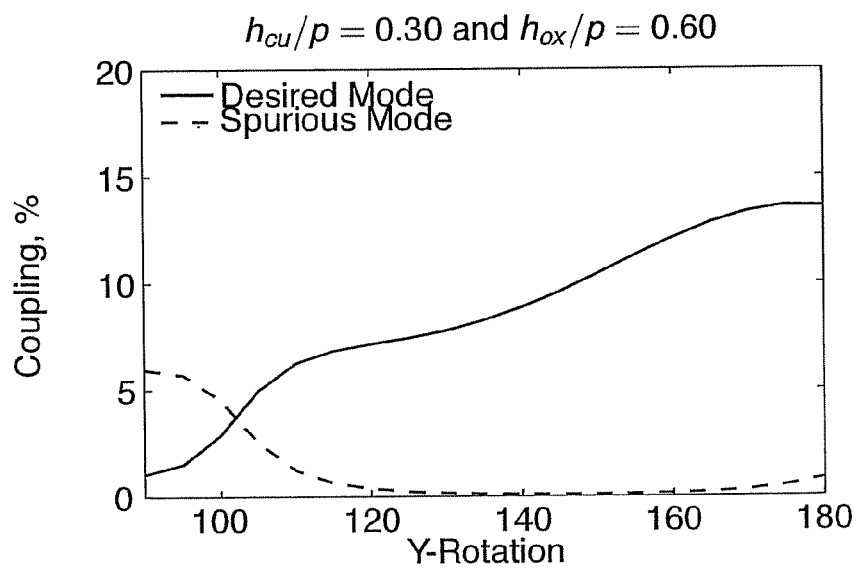

FIG. 8 is a graph that illustrates coupling coefficients for the desired mode and the spurious mode on a YX-LN substrate with h_el/p=0.30 and h_do/p=0.60 in accordance with some embodiments.

Figure 9:
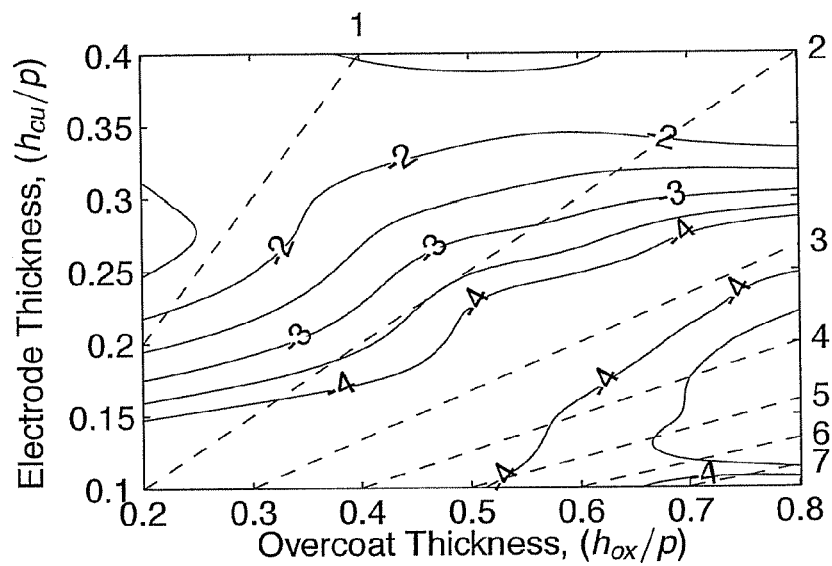

FIG. 9 is a graph that illustrates coupling coefficients for the spurious mode ($\log_{10}(K^2)$) for a 127° YX-LN substrate in accordance with some embodiments.

Figure 10:
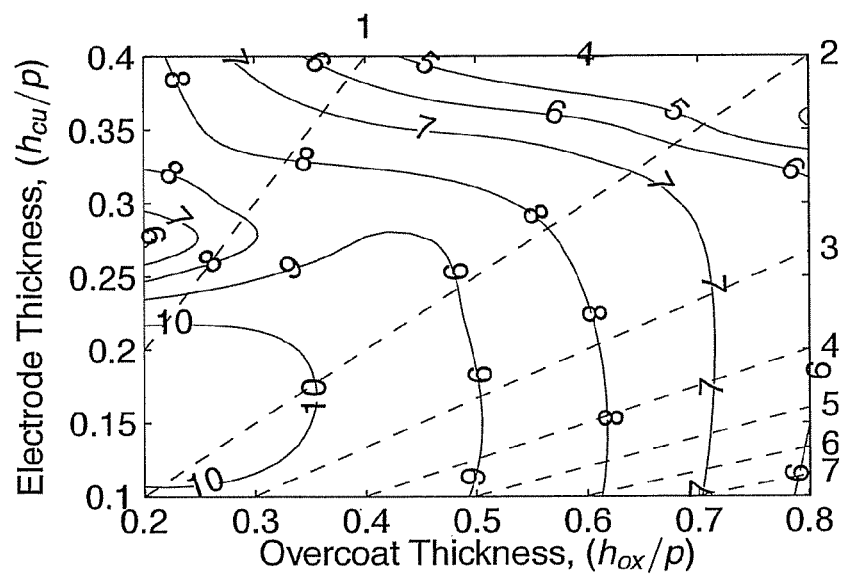

FIG. 10 is a graph that illustrates coupling coefficient percentages for a 127° YXLN substrate in accordance with some embodiments.

Figure 11:
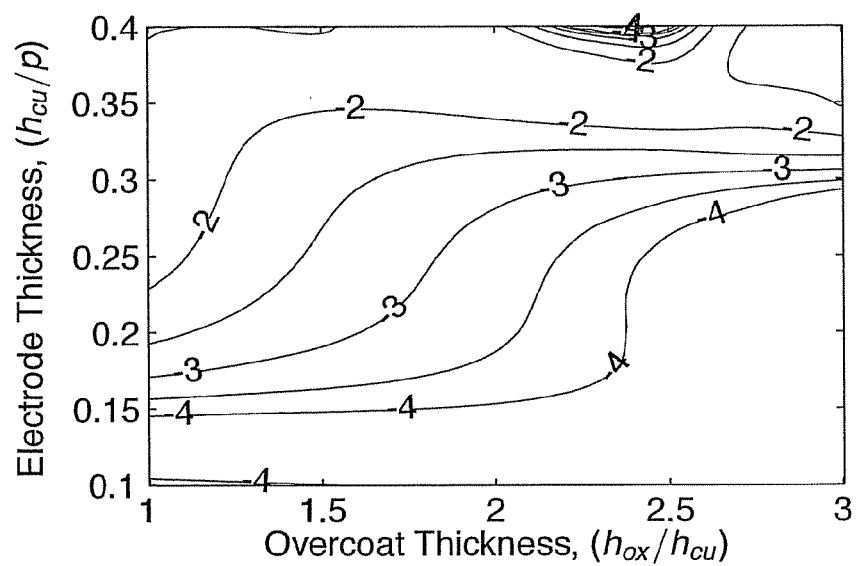

FIG. 11 is a graph that illustrates coupling coefficients for the spurious mode ($\log_{10}(K^2)$) for a 127° YX-LN substrate in accordance with some embodiments.

Figure 12:
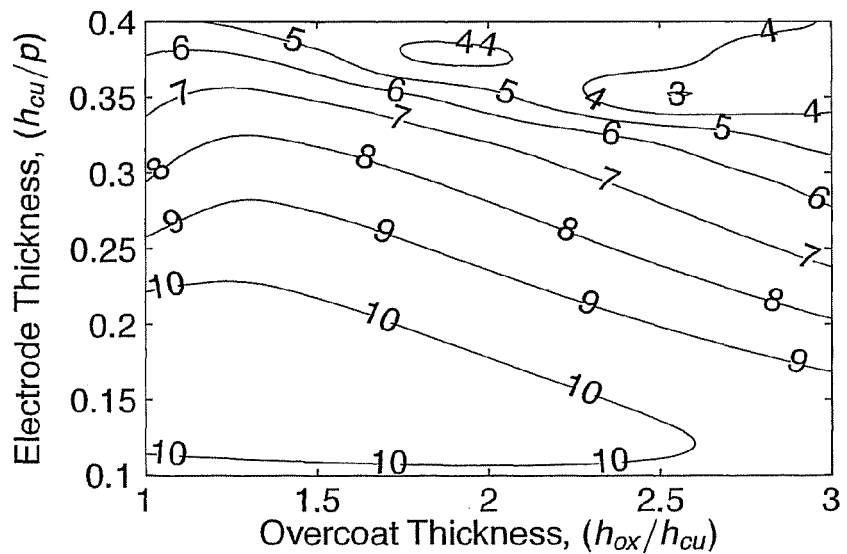

FIG. 12 is a graph that illustrates coupling coefficient percentages for a 127° YX-LN substrate in accordance with some embodiments.

Figure 13:
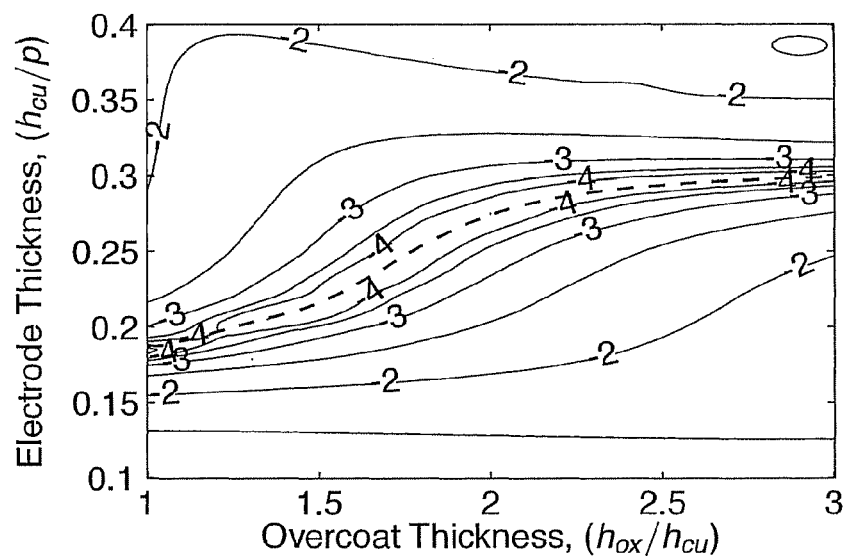

FIG. 13 is a graph that illustrates coefficients for the spurious mode ($\log_{10}(K^2)$) for a 150° YX-LN substrate in accordance with some embodiments.

Figure 14:
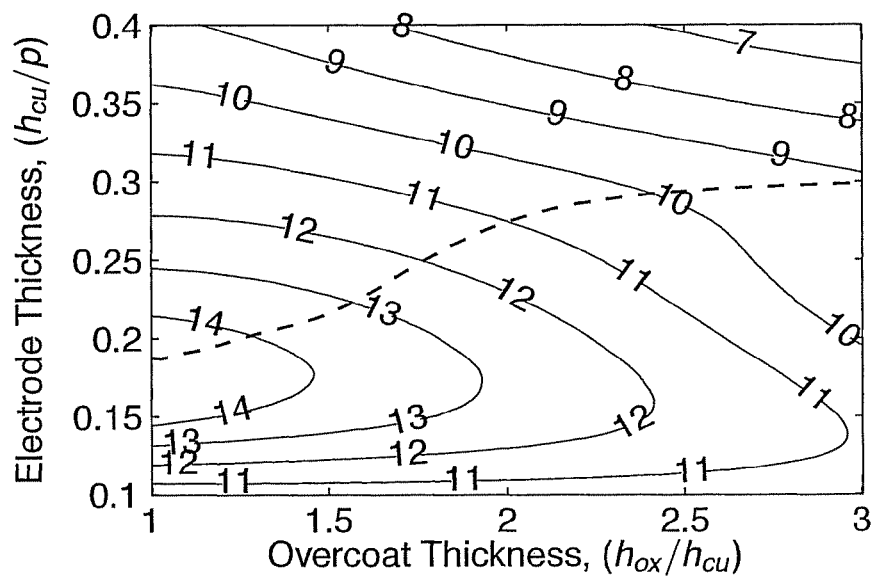

FIG. 14 is a graph that illustrates coupling coefficient percentages for 150° YX-LN substrate.

Figure 15:
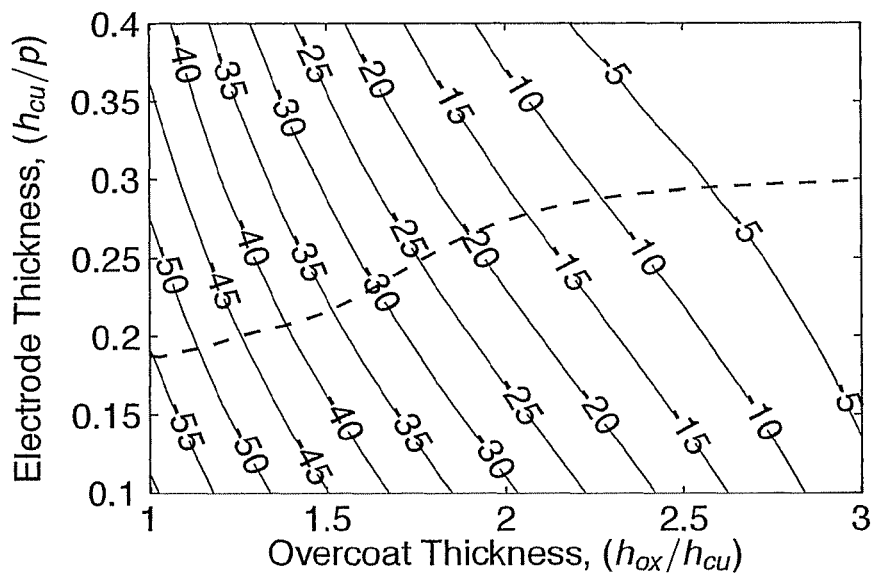

FIG. 15 is a graph that illustrates TCF at resonance for a 150° YX-LN substrate in accordance with some embodiments.

Figure 16:
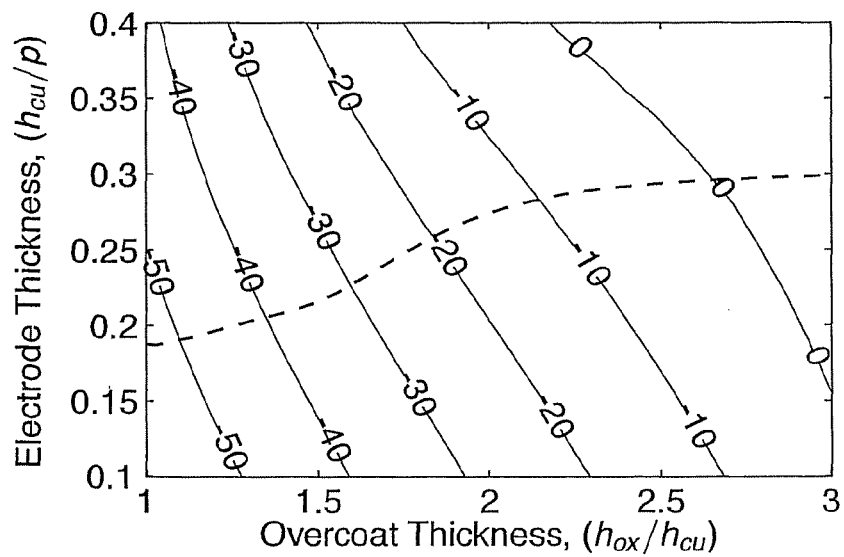

FIG. 16 is a graph that illustrates TCF at anti-resonance for a 150° YX-LN substrate in accordance with some embodiments.

Figure 17:
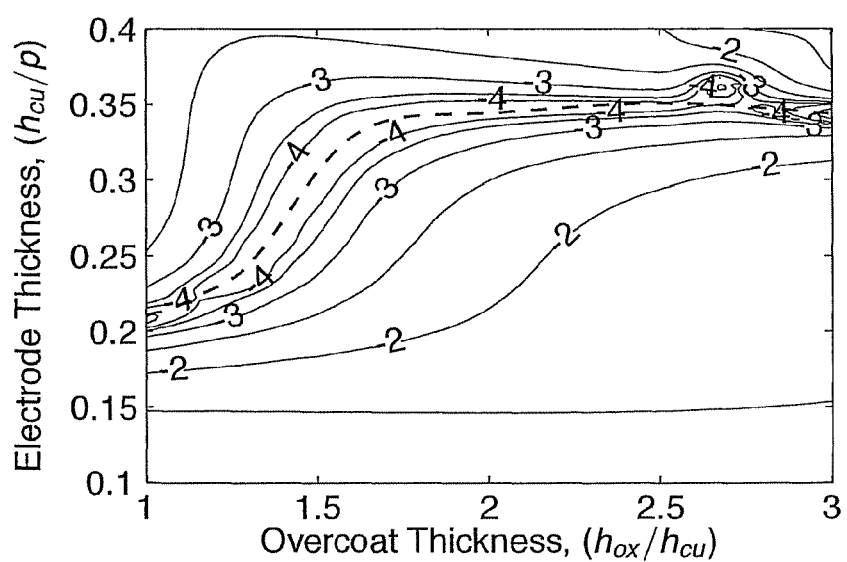

FIG. 17 is a graph that illustrates spurious mode coupling ($\log_{10}(K^2)$) for a device having copper electrodes with a duty factor of a/p=0.4 on a 150° YX-LN substrate in accordance with some embodiments.

Figure 18:
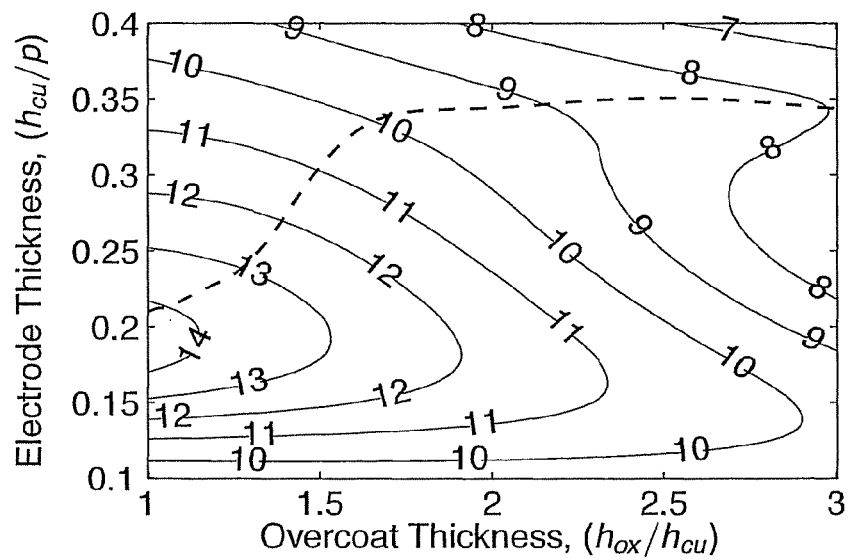

FIG. 18 is a graph that illustrates coupling percentage for a device having copper electrodes with a duty factor of a/p=0.4 on a 150° YX-LN substrate in accordance with some embodiments.

Figure 19:
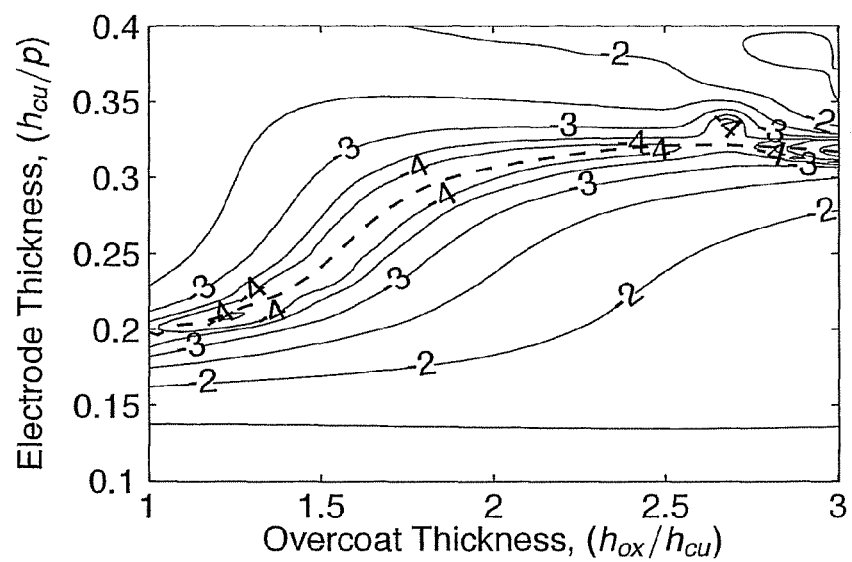

FIG. 19 is a graph that illustrates spurious mode coupling ($\log_{10}(K^2)$) for device having copper electrodes with a duty factor of a/p=0.45 on a 150° YX-LN substrate in accordance with some embodiments.

Figure 20:
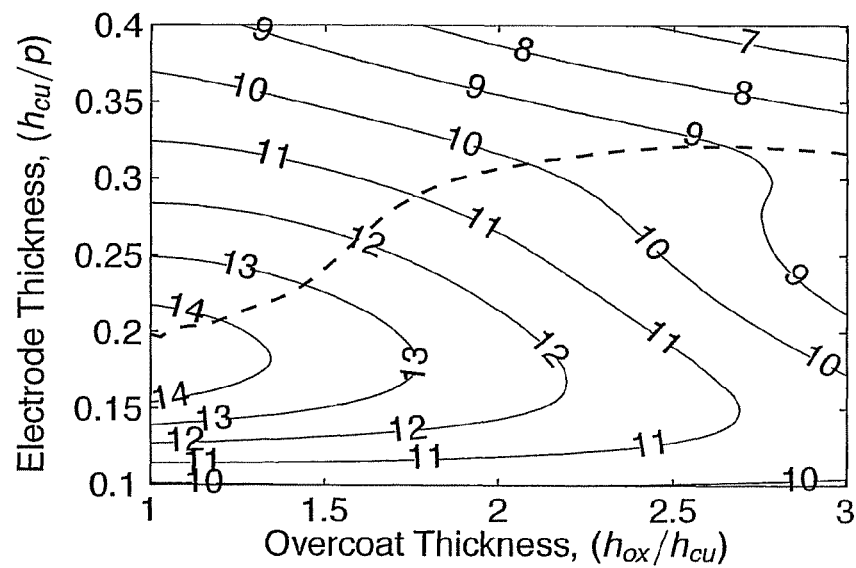

FIG. 20 is a graph that illustrates coupling percentage for a device having copper electrodes with a duty factor of a/p=0.45 on a 150° YX-LN substrate in accordance with some embodiments.

Figure 21:
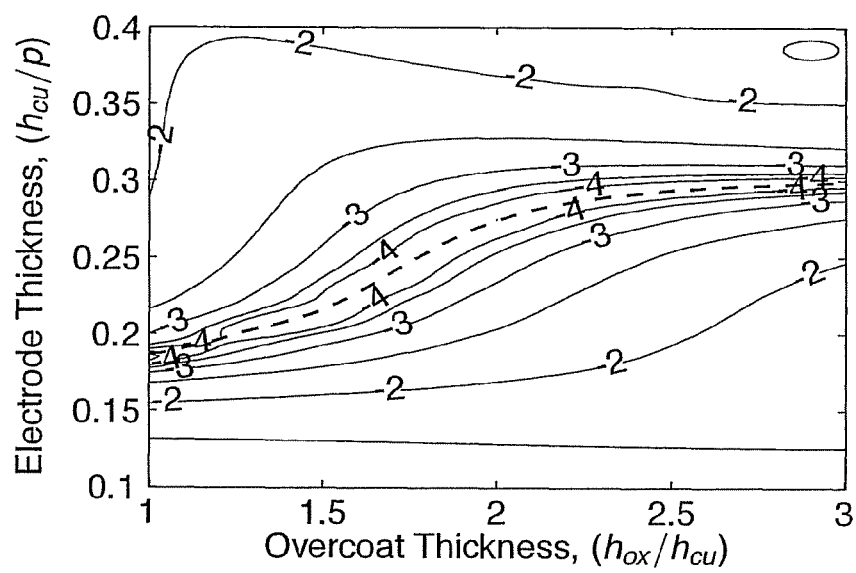

FIG. 21 is a graph that illustrates spurious mode coupling ($\log_{10}(K^2)$) for device having copper electrodes with a duty factor of a/p=0.5 on a 150° YX-LN substrate in accordance with some embodiments.

Figure 22:
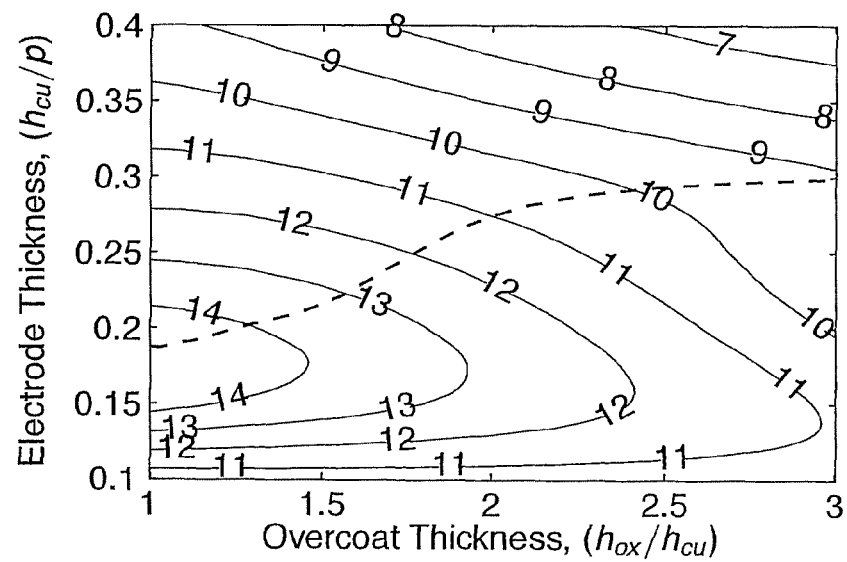

FIG. 22 is a graph that illustrates coupling percentages for a device having copper electrodes with a duty factor of a/p=0.5 on a 150° YX-LN substrate in accordance with some embodiments.

Figure 23:
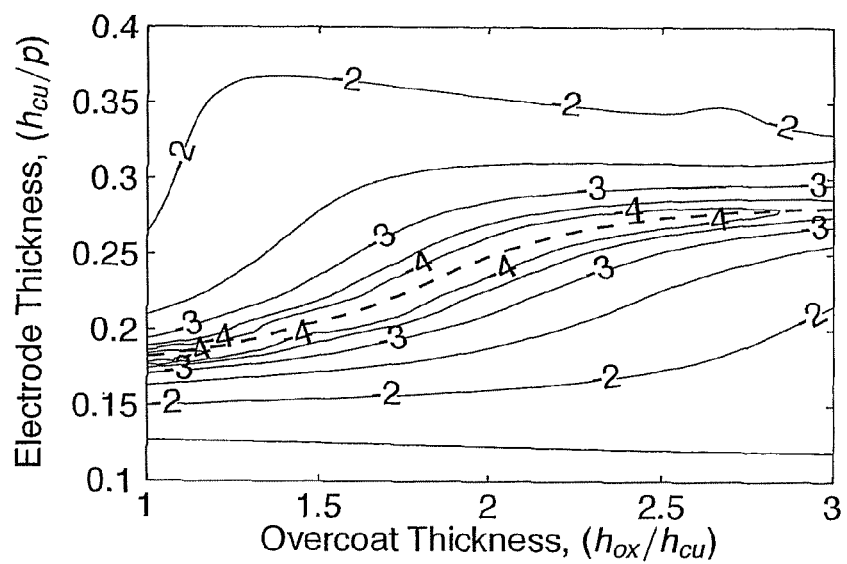

FIG. 23 is a graph that illustrates spurious mode coupling ($\log_{10}(K^2)$) for device having copper electrodes with a duty factor of a/p=0.55 on a 150° YX-LN substrate in accordance with some embodiments.

Figure 24:
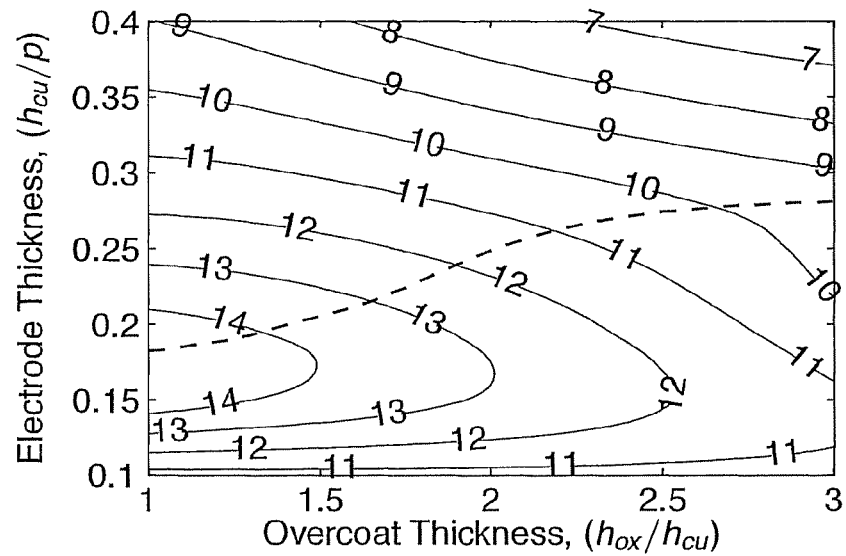
Figure 25:
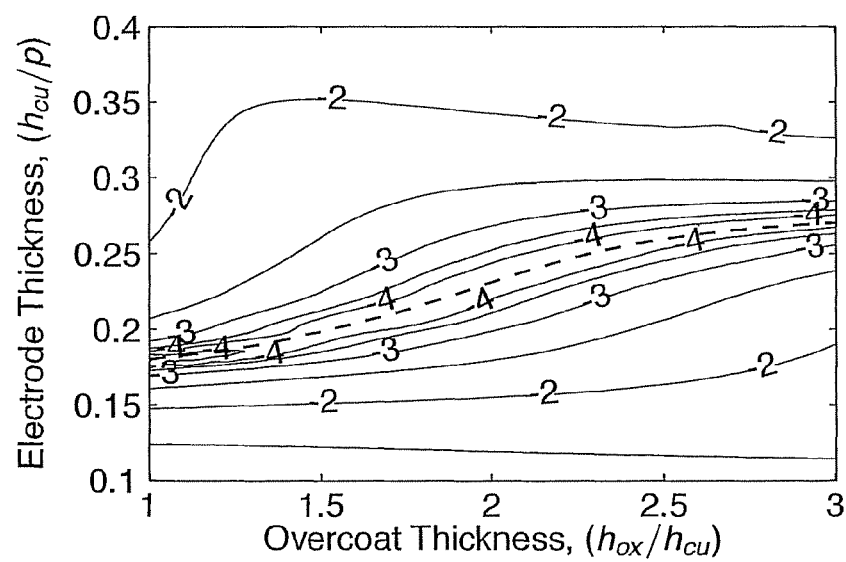

FIG. 24 is a graph that illustrates coupling percentages for a device having copper electrodes with a duty factor of a/p=0.55 on a 150° YX-LN substrate in accordance with some embodiments FIG. 25 is a graph that illustrates spurious mode coupling ($\log_{10}(K^2)$) for device having copper electrodes with a duty factor of a/p=0.6 on a 150° YX-LN substrate in accordance with some embodiments.

Figure 26:
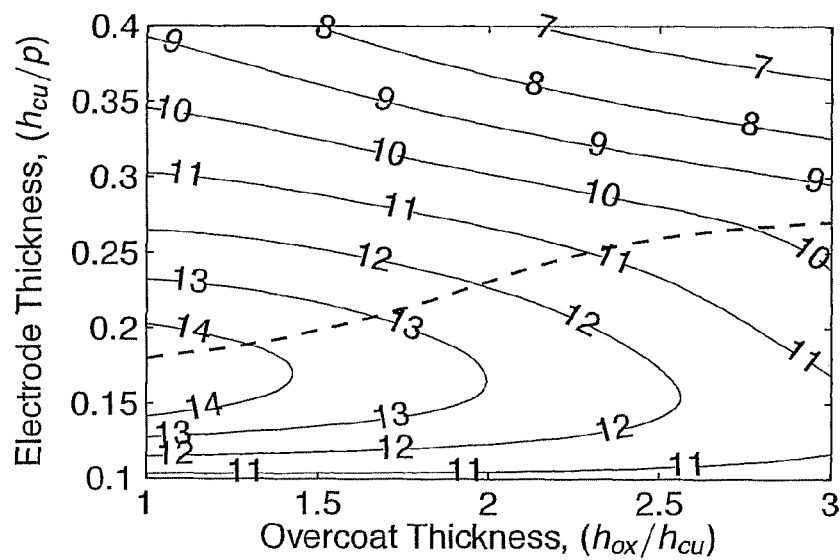

FIG. 26 is a graph that illustrates coupling percentages for a device having copper electrodes with a duty factor of a/p=0.6 on a 150° YX-LN substrate in accordance with some embodiments.

Figure 27:
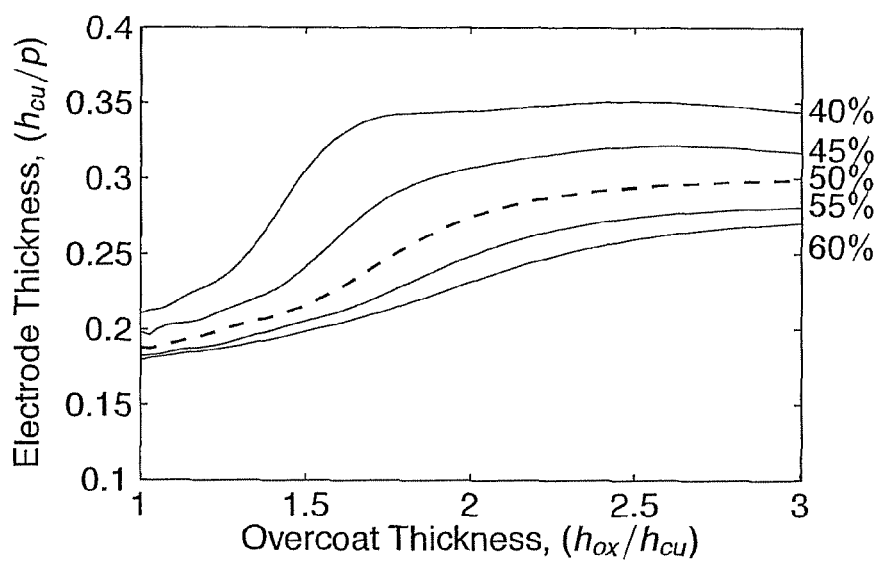

FIG. 27 is a graph that illustrates lines of minimum spurious modes for a device having copper electrodes with duty factors of a/p=0.4, 0.45, 0.5, 0.55, and 0.6 on a 150° YX-LN substrate in accordance with some embodiments.

Figure 28:
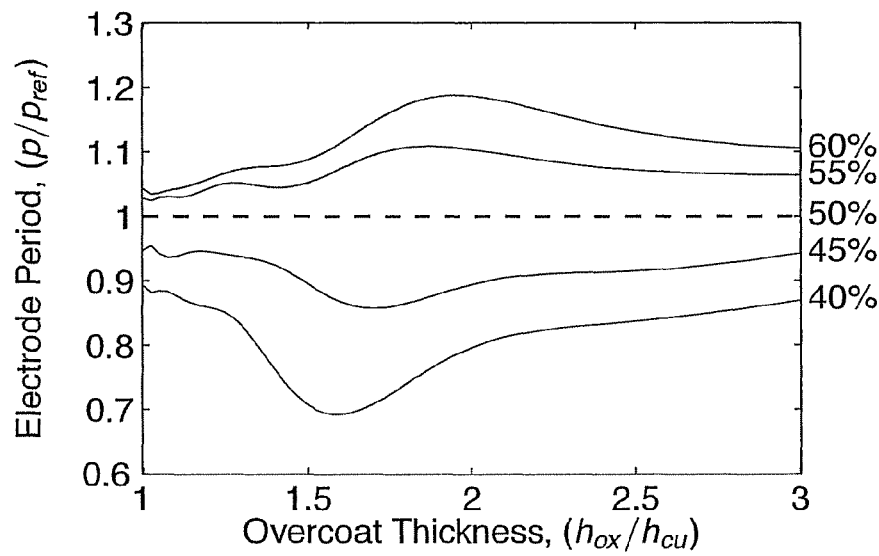

FIG. 28 is a graph that illustrates spurious free lines for constant duty factors as a function of normalized period and the ratio of overcoat-to-electrode thicknesses in accordance with some embodiments.

Figure 29:
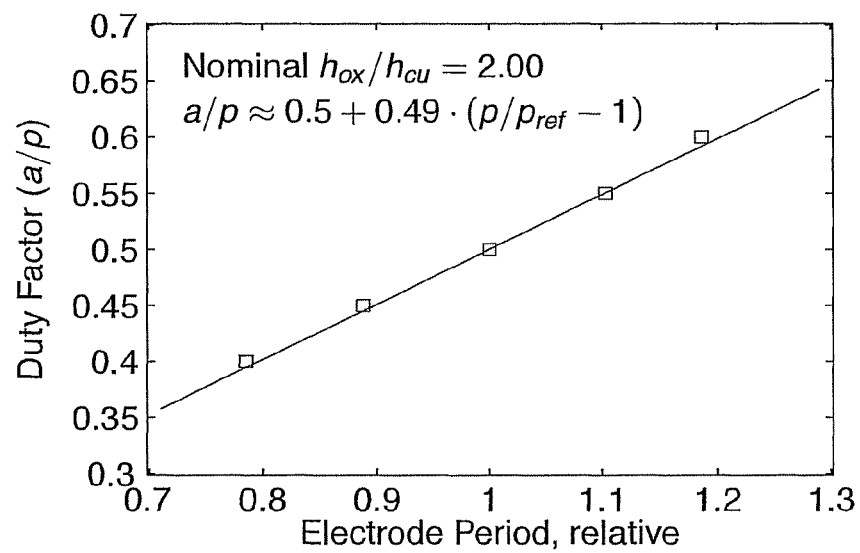

FIG. 29 is a graph that illustrates a spurious duty factor that is approximately linear with period for a device with a 150° YX-LN substrate, and h_do/h_el=2.0 in accordance with some embodiments.

Figure 30:
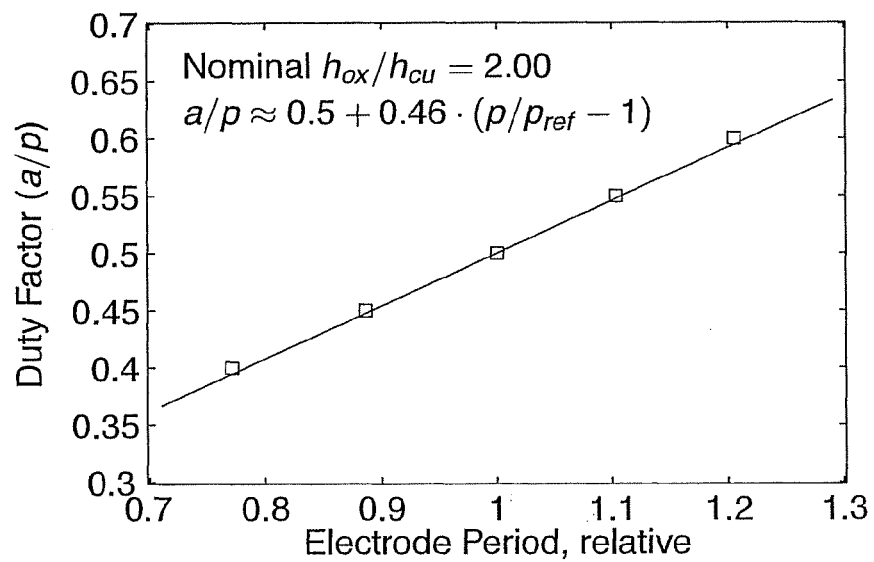

FIG. 30 is a graph that illustrates a spurious-free duty factor that is approximately linear with period for a device having a 140° YX-LN substrate and h_do/h_el=2.0 in accordance with some embodiments.

Figure 31:
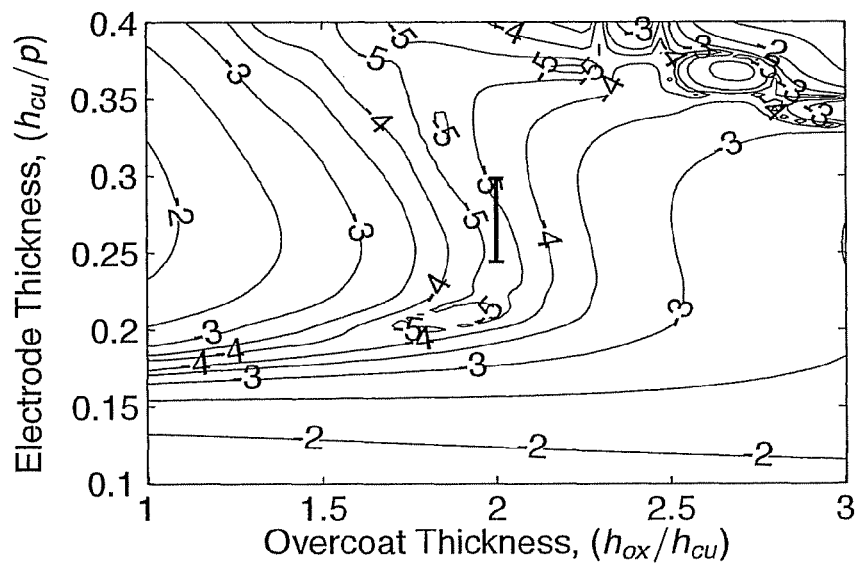

FIG. 31 is a graph that illustrates that a spurious coupling is negligible for a wide variation of period in accordance with some embodiments.

Figure 32:
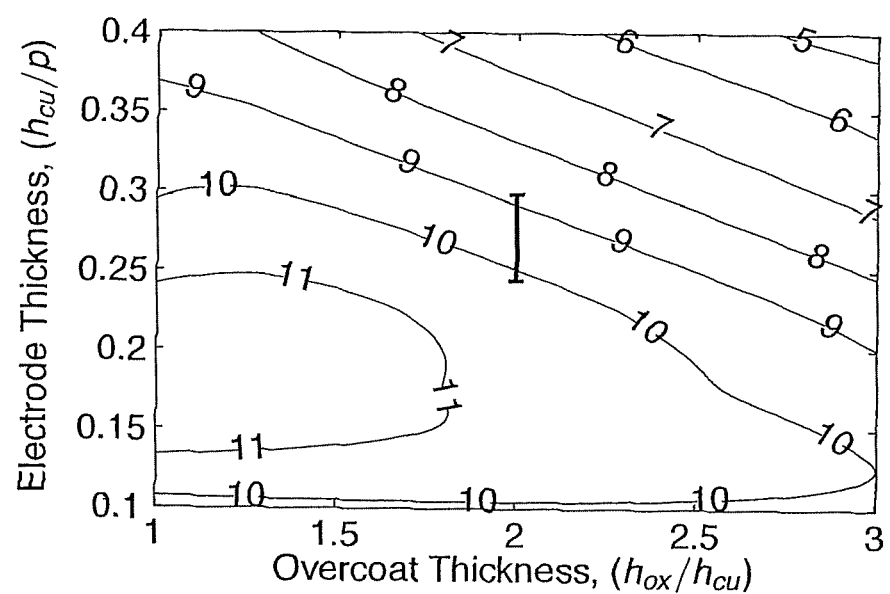

FIG. 32 is a graph that illustrates coupling coefficient percentage across a region of negligible spurious content in accordance with some embodiments.

Figure 33:
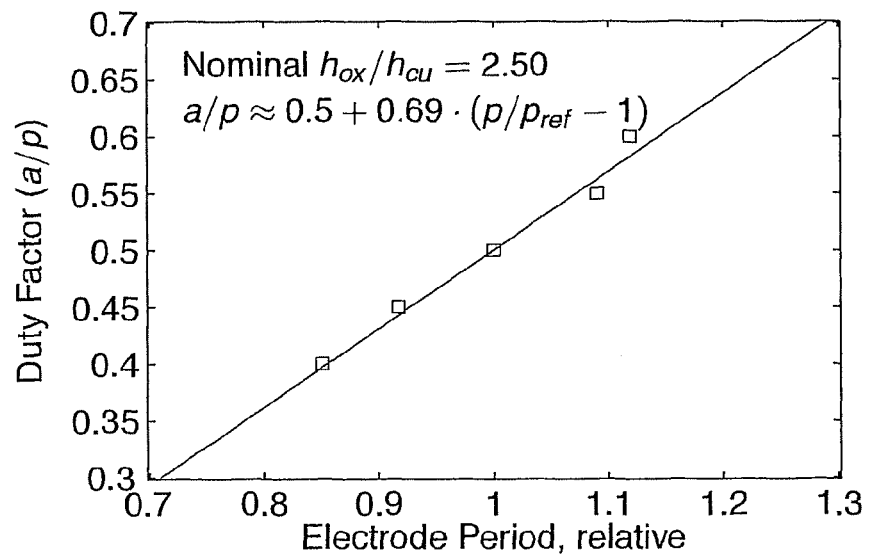

FIG. 33 is a graph that illustrates a spurious-free duty factor that is approximately linear with period for a device having a 140° YX-LN substrate and h_do/h_el=2.5 in accordance with some embodiments.

Figure 34:
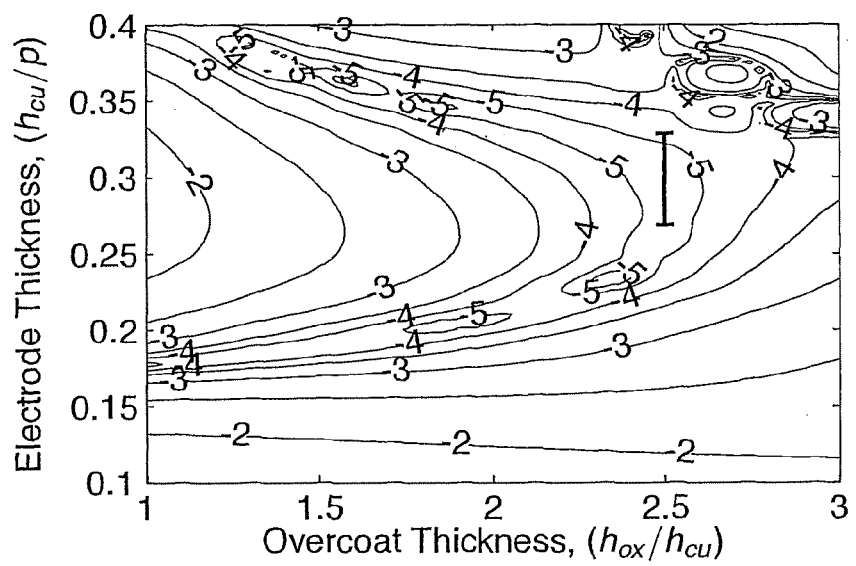

FIG. 34 is a graph that illustrates that spurious coupling is negligible for a wide variation of period in accordance with some embodiments.

Figure 35:
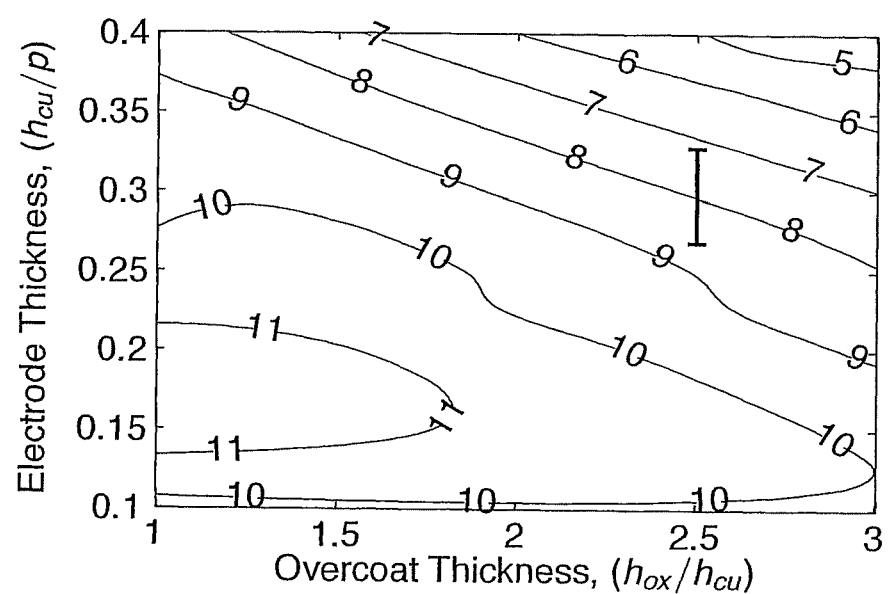

FIG. 35 is a graph that illustrates coupling coefficient percentage across a region of negligible spurious content in accordance with some embodiments.

Figure 36:
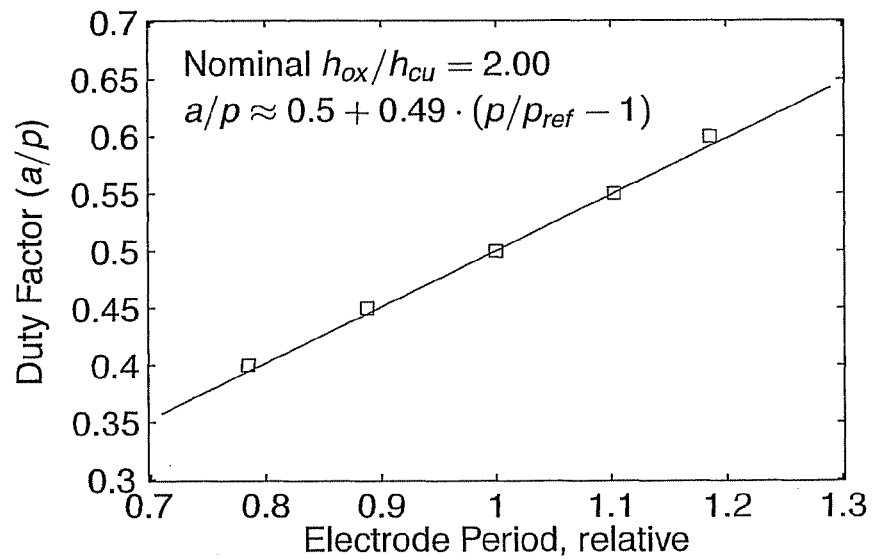

FIG. 36 is a graph that illustrates that spurious-free duty factor is approximately linear with period for a device having a 150° YX-LN substrate and h_do/h_el=2.0 in accordance with some embodiments.

Figure 37:
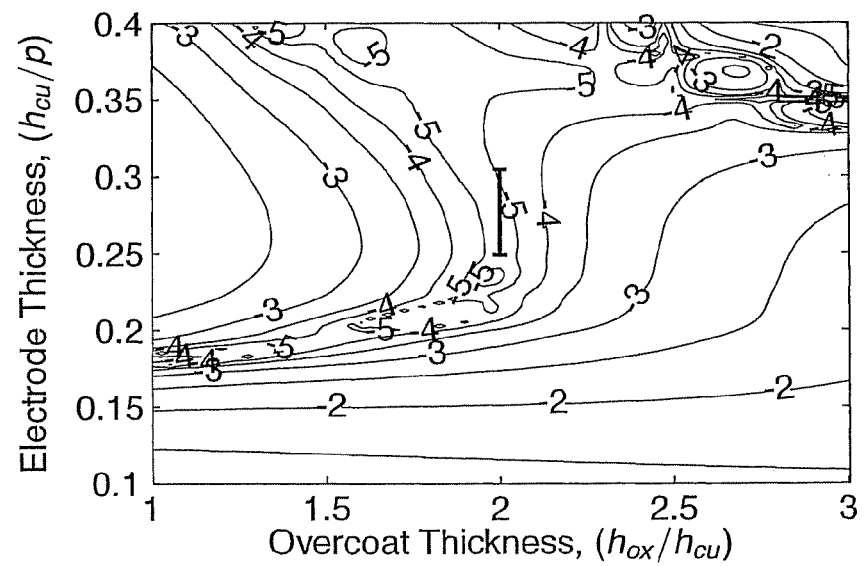

FIG. 37 is a graph that illustrates that spurious coupling is negligible for a wide variation of period in accordance with some embodiments.

Figure 38:
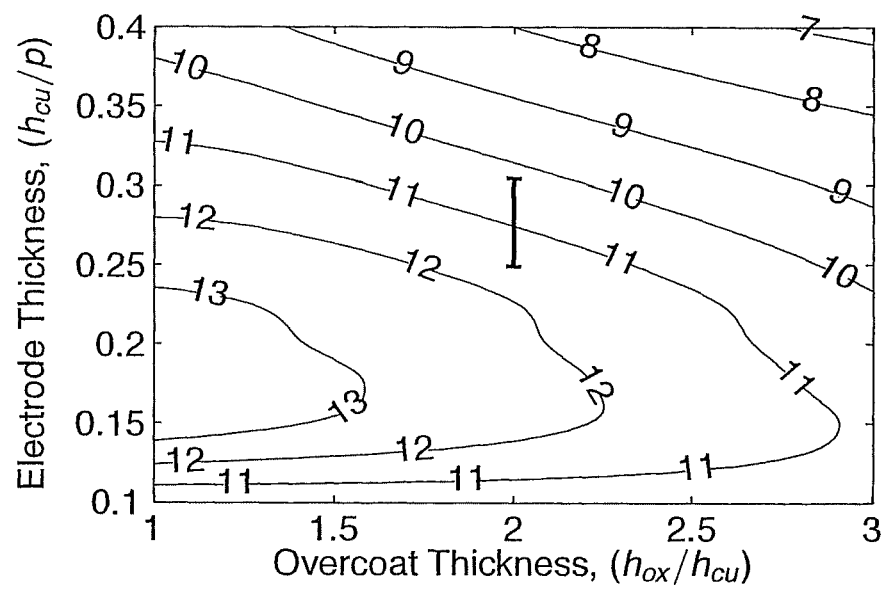

FIG. 38 is a graph that illustrates coupling coefficient percentage across a region of negligible spurious content in accordance with some embodiments.

Figure 39:
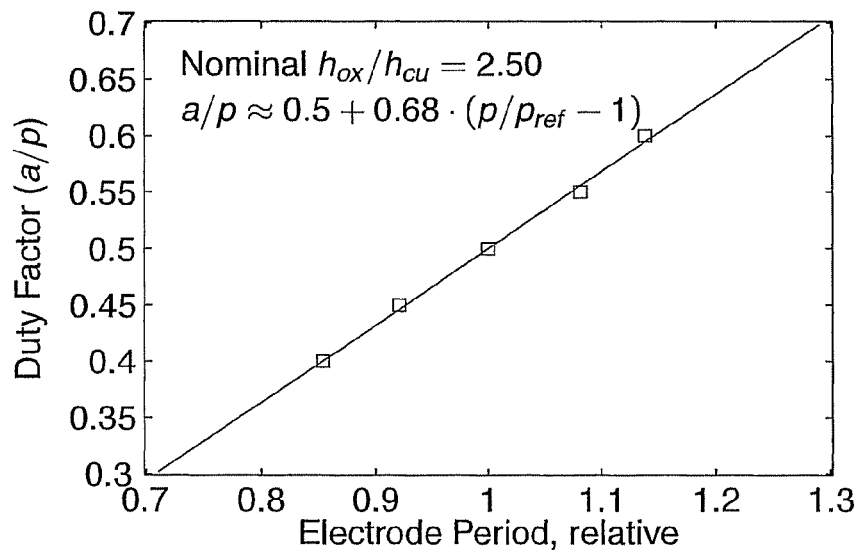

FIG. 39 is a graph that illustrates that a spurious free duty factor is approximately linear with period for a device having a 150° YX-LN substrate and h_do/h_el=2.5 in accordance with some embodiments.

Figure 40:
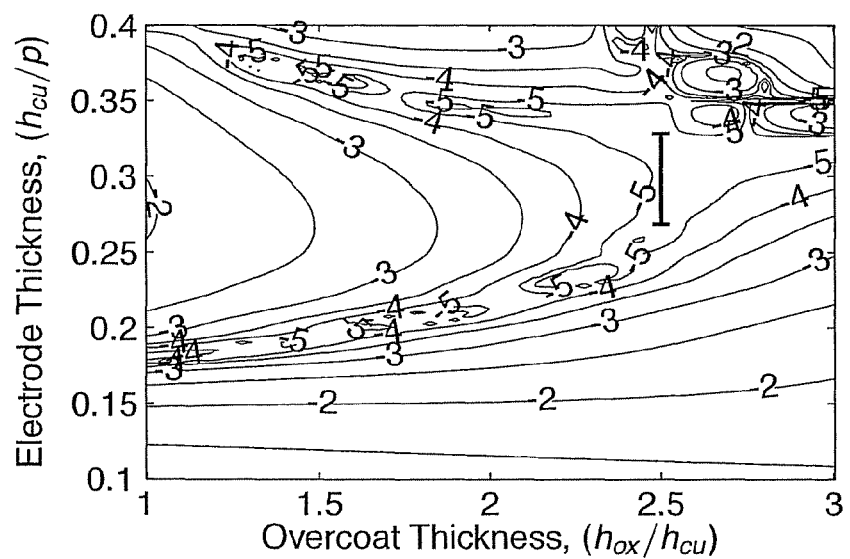

FIG. 40 is a graph that illustrates that spurious coupling is negligible for a wide variation of period in accordance with some embodiments.

Figure 41:
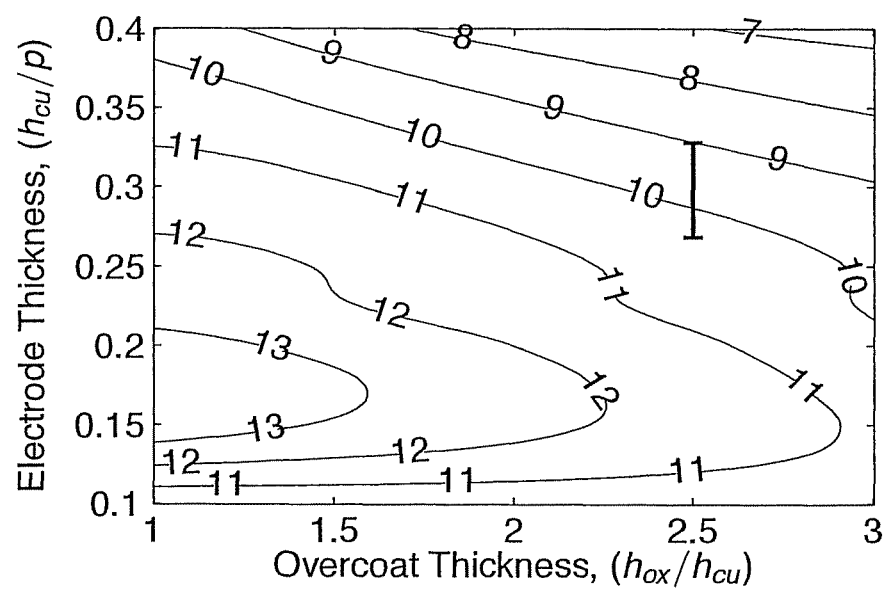

FIG. 41 is a graph that illustrates that coupling coefficient percentage across regions of negligible spurious content is improved as compared to devices having 127° and 140° YX-LN substrates in accordance with some embodiments.

Figure 42:
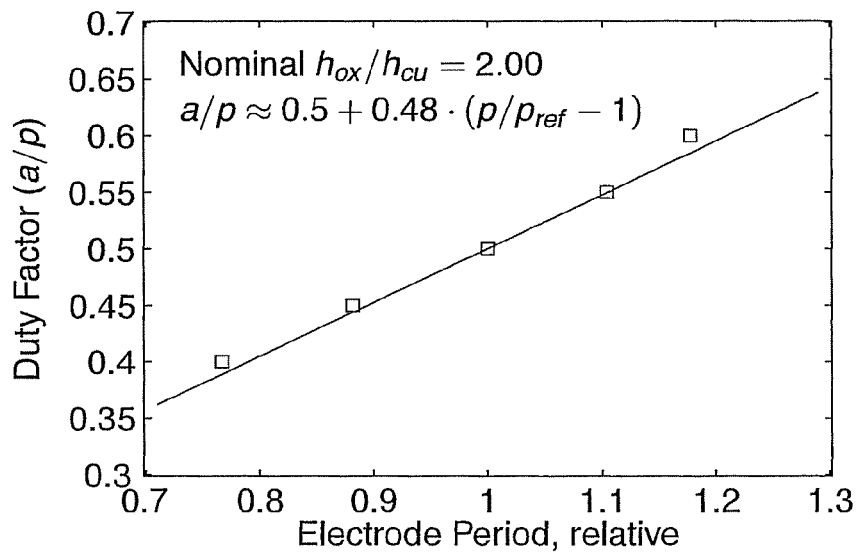

FIG. 42 is a graph that illustrates that a spurious free duty factor is approximately linear with period for a device having a 160° YX-LN substrate and h_do/h_el=2.0 in accordance with some embodiments.

Figure 43:
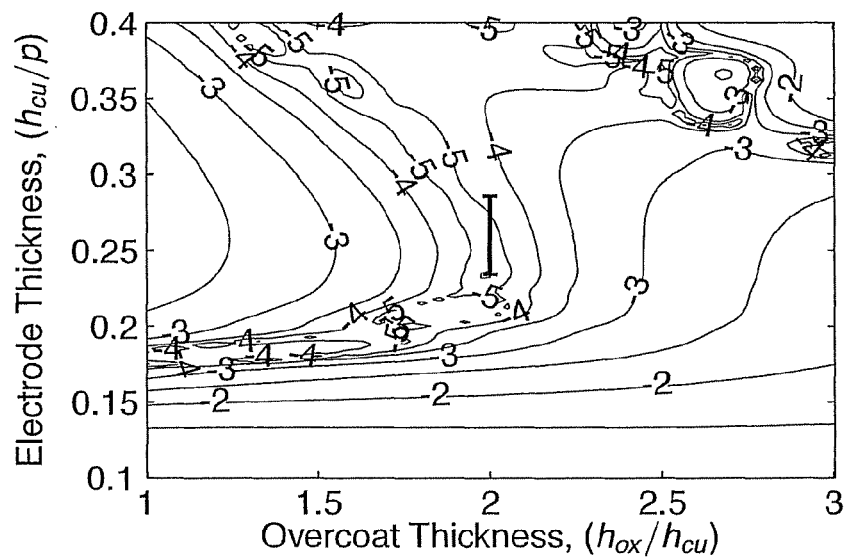

FIG. 43 is a graph that illustrates that spurious coupling is negligible for a wide variation of period in accordance with some embodiments.

Figure 44:
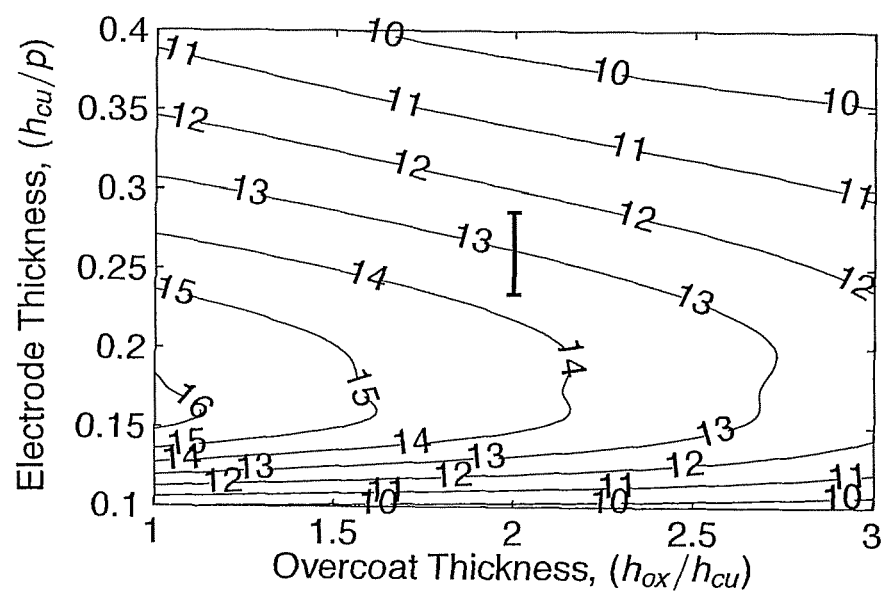

FIG. 44 is a graph that illustrates that coupling coefficient percentages across the region of negligible spurious content is improved as compared to devices having 127°, 140°, and 150° YX-LN substrates in accordance with some embodiments.

Figure 45:
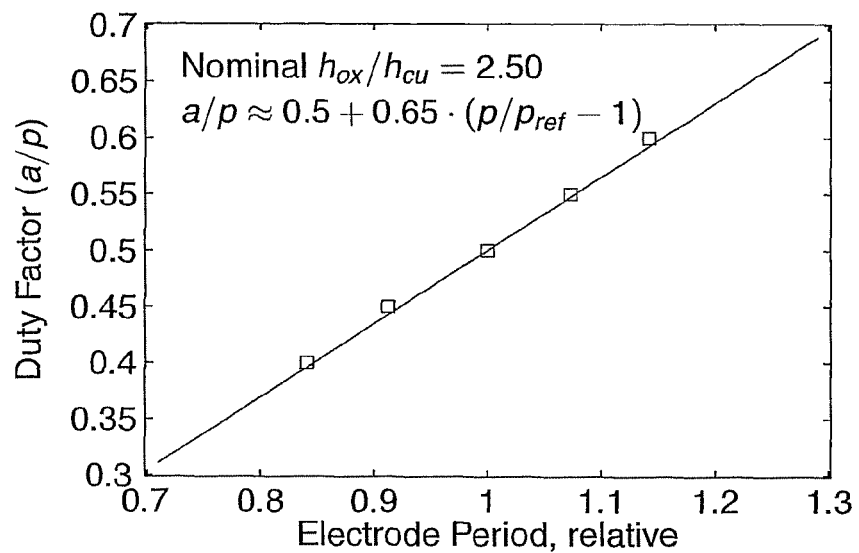

FIG. 45 is a graph that illustrates that a spurious free duty factor is approximately linear with period for a device having a 160° YX-LN substrate and h_do/h_el=2.5 in accordance with some embodiments.

Figure 46:
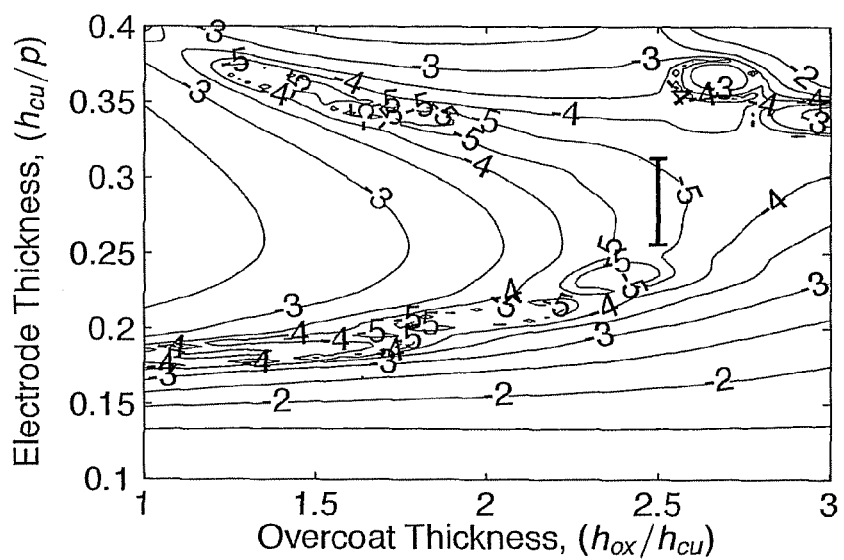

FIG. 46 is a graph that illustrates that spurious coupling is negligible for a wide variation of period in accordance with some embodiments.

Figure 47:
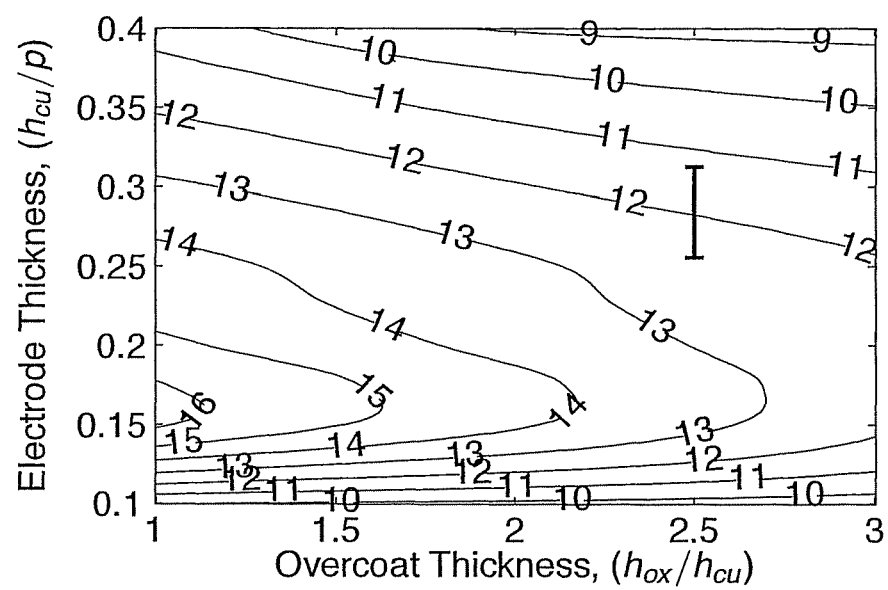

FIG. 47 is a graph that illustrates that coupling coefficient percentage across the region of negligible spurious content is improved as compared to devices having 127°, 140°, and 150° YX-LN substrates in accordance with some embodiments.

Figure 48:
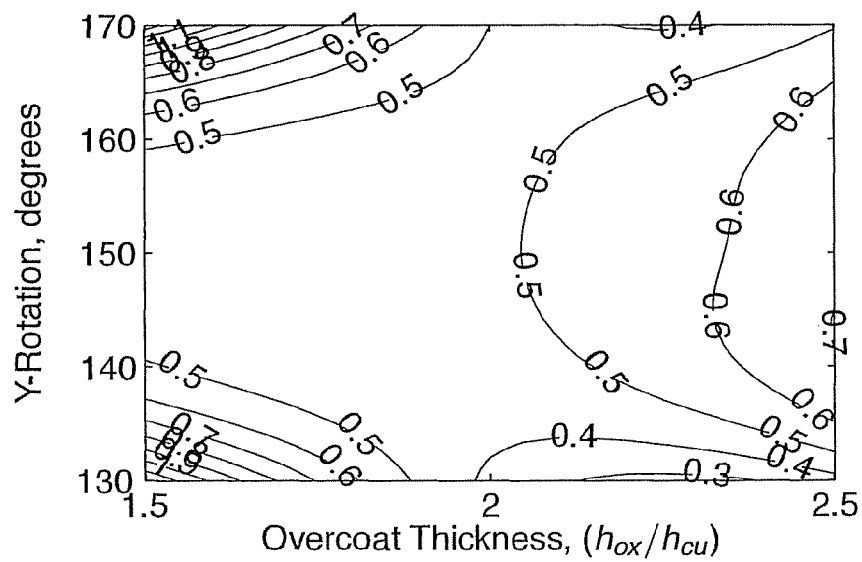

FIG. 48 is a graph that illustrates contours of duty factor slope ($\chi$) as a function of y-rotation and the ratio of overcoat-to-electrode thickness in accordance with some embodiments.

Figure 49:
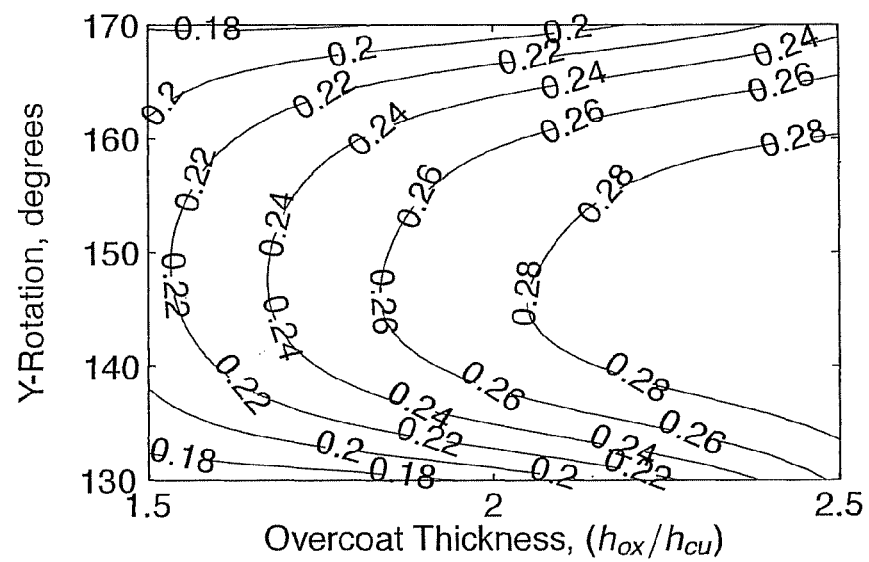

FIG. 49 is a graph that illustrates contours electrode thickness divided by reference period (p_ref) as a function of y-rotation and the ratio of overcoat-to-electrode thickness in accordance with some embodiments.

Figure 50:
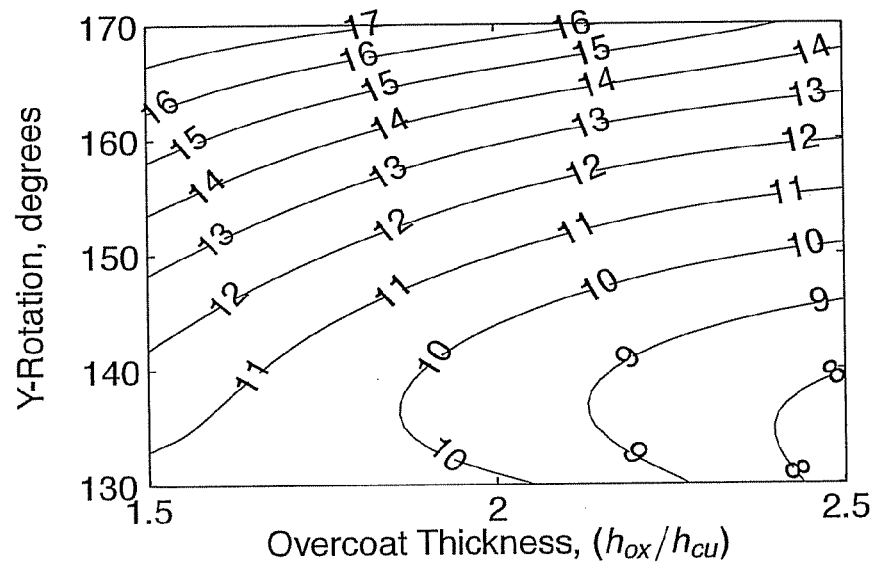

FIG. 50 is a graph that illustrates contours of coupling coefficient ($K^2$ in %) as a function of y-rotation and the ratio of overcoat-to-electrode thickness in accordance with some embodiments.

Figure 51:
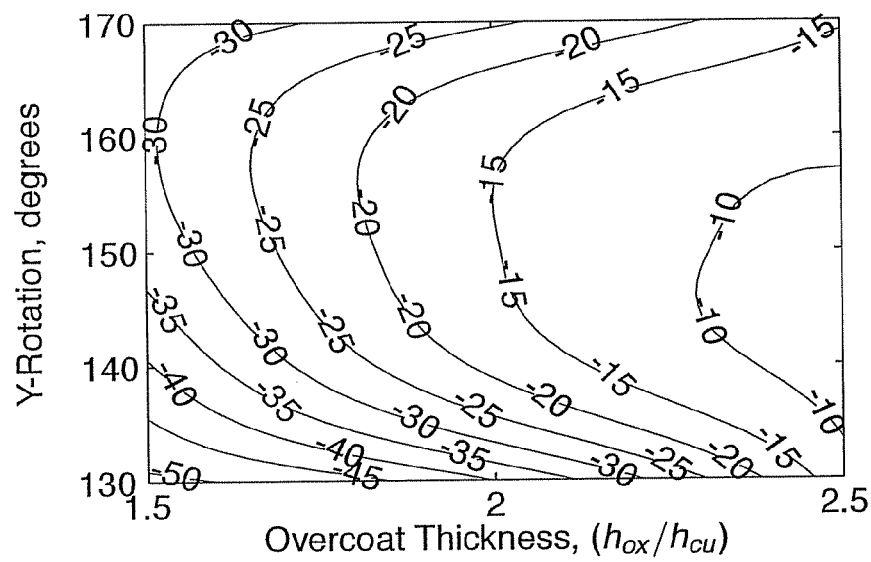

FIG. 51 is a graph that illustrates contours of resonant-frequency TCF (ppm/° C.) as a function of y-rotation and the ratio of overcoat-to-electrode thickness in accordance with some embodiments.

Figure 52:
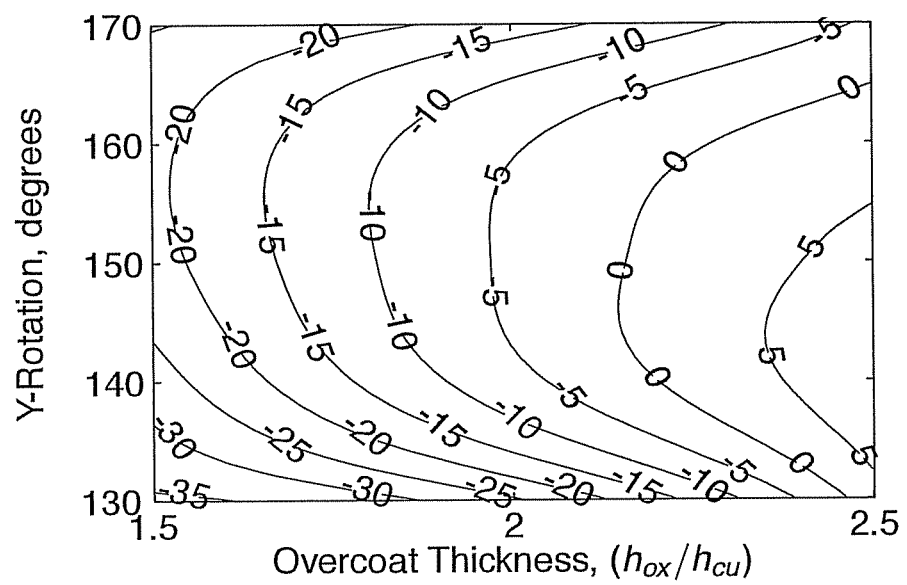

FIG. 52 is a graph that illustrates contours of anti-resonant frequency TCF (ppm/° C.) as a function of y-rotation and the ratio of overcoat-to-electrode thickness in accordance with some embodiments.

DETAILED DESCRIPTION OF EMBODIMENTS

The present invention will now be described more fully hereinafter with reference to the accompanying drawings, in which preferred embodiments of the invention are shown. Unless otherwise defined, all technical and scientific terms used herein are intended to have the same meaning as commonly understood in the art to which this invention pertains at the time of filing. Although various methods and materials similar or equivalent to those described herein can be used in the practice or testing of the present invention, suitable methods and materials are described below. However, those skilled in the art will understand that the methods and materials used and described are examples and may not be the only ones suitable for use in the invention.

Moreover, it should also be understood that any temperature, weight, volume, time interval, range, other measurements, quantities and numerical expressions given herein are intended to be approximate and not exact or critical values unless expressly stated to the contrary. Where appropriate to the invention and as understood by those of skill in the art, it is proper to describe the various aspects of the invention using approximate or relative terms and terms of degree commonly employed in patent applications, such as dimensioned, about, approximately, substantially, essentially, comprising, and the like.

Materials, methods and examples given are illustrative in nature only and not intended to be limiting.

Accordingly, this invention may be embodied in many different forms and should not be construed as limited to the illustrated embodiments set forth herein. Rather, these illustrated embodiments are provided so that this disclosure will be thorough, complete, and will fully convey the scope of the invention to those skilled in the art. Other features and advantages of the invention will be apparent from the following detailed description and claims.

Figure 1:
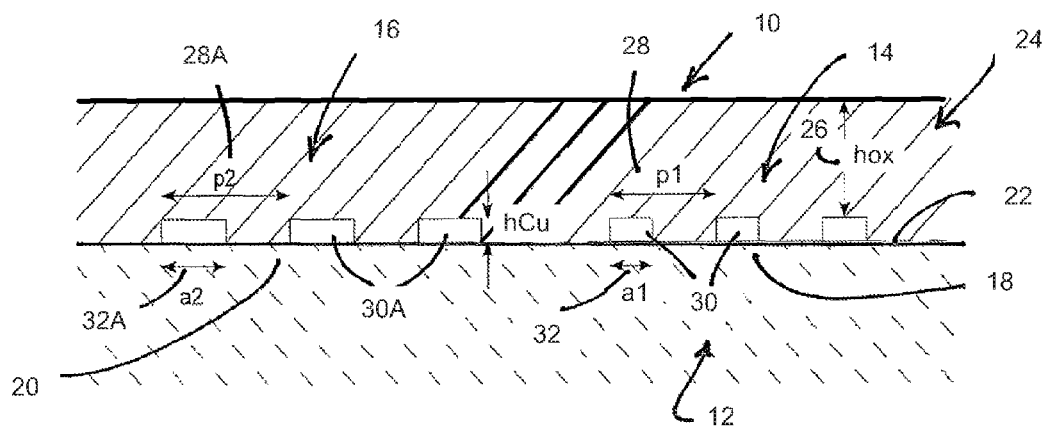
FIG. 1 is a diagrammatical cross sectional view illustrating one SAW device according to some embodiments, wherein two or more resonators and two or more electrode periods with the electrode spacing adjusted to a specified width to suppress the coupling factor for spurious modes for each resonator.

With reference initially to FIG. 1, one embodiment of the present invention is herein described, by way of example, as a surface acoustic wave (SAW) device 10 comprising a substrate 12, e.g., a single crystal piezoelectric substrate, for providing a propagation of an acoustic wave, e.g., a leaky acoustic wave. For the embodiment herein described by way of example, first and second resonators 14, 16 are formed by first and second electrode patterns 18, 20 on a surface 22 of the substrate 12. The first resonator 14 has a dielectric overcoat 24, with a positive TCF, in a form of a silicon oxide layer of thickness 26 (also referred to as h_do) disposed between and over the electrodes 30, an electrode period 28 (also referred to as p1), and electrodes 30 having an electrode width 32 (also referred to as a1). The second resonator 16 shares the dielectric overcoat 24 of silicon oxide with the first resonator 18, has an electrode period 28A (also referred to as p2), and electrodes 30A having an electrode width 32A (also referred to as a2).

In various embodiments, the relationship between the electrode periods and widths may be specifically configured to facilitate efficient operation of the SAW device 10. Efficient operation may include, e.g., exhibition of a strong electromechanical coupling factor, reduced temperature coefficient of frequency (TCF), and/or robust suppression of spurious modes. In some embodiments, the relationship of the electrode width to electrode period may be such that each electrode period, e.g., p1, is associated with a respective ratio of electrode width-to-period, e.g., a1/p1. A ratio of electrode width-to-period may also be referred to as a "duty factor." Thus, for example, an embodiment may have electrodes arranged with a plurality of different electrode periods with each of the plurality of different electrode periods being associated with a respective ratio of electrode width-to-period. The embodiment shown in FIG. 1 generally portrays two resonators with the electrodes within each resonator having a common electrode period and width. However, other embodiments may have other numbers of resonators, with one or more of the resonators having one or more different electrode periods and/or electrode widths.

In some embodiments, the widths 32, 32A of the electrodes 30, 30A follow a prescribed relationship. This relationship, according to some embodiments, is conveniently described using the normalized spacing between neighboring electrodes, (pN−aN)/pN. By way of example, if the period 28 of the first resonator 14 is smaller than the period 28A of the second resonator 16, i.e., (p1<p2), the relative spacing between electrodes 30 of the first resonator 14 will be larger than the relative spacing between electrodes 30A of the second resonator 16, i.e., (p1−a1)/p1>(p2−a2)/p2.

In some embodiments, the spacing between the electrodes of the first and second resonators is inversely proportional to the electrode period of the resonator, thus increasing the spacing as the electrode period decreases, a2/p2>a1/p1.

In some embodiments, the two resonators 14, 16 may have respective electrode periods 28, 28A and widths 32, 32A satisfying the relationship (a1−a2)/(p1−p2)>1.

For the embodiment herein described by way of example, and from resulting performance data herein presented and described by way of example, mass of the electrodes 30, 30A may be primarily provided by copper (Cu) providing what may be referred to as "heavy electrodes." These heavy electrodes may have a density that substantially exceeds a density of the dielectric overcoat 24. In some embodiments, linear dimensions, e.g., thickness 36 (also referred to as h_el) or width (a), of the electrodes 30, 30A may be primarily provided by one or more other materials, e.g., aluminum. In various embodiments, the thickness 36 may be in the range of approximately ten to forty percent of a period associated with an individual electrode. In some embodiments, the thickness 36 may be in the range of about fifteen to twenty-five percent of a period associated with an individual electrode. While the thickness 36 is shown as being generally the same for all the electrodes of FIG. 1, in other embodiments various electrode thicknesses may be used.

In some embodiments, heavy electrodes, e.g., electrodes 30, 30A, may ensure that leaky waves, e.g., LSAWs, existing on the substrate 12 are sufficiently slowed such that a wave velocity is reduced below that of a slow shear bulk wave. In such an instance, the leakage nature of these LSAWs, resulting from LSAW energy leaking into a bulk acoustic wave, may be suppressed.

The selection of the heavy electrode geometry may be accompanied by a preferred selection of the thickness 26 of the dielectric overcoat 24 so as to ensure that a spurious mode's response is suppressed and limits any negative impact on the filter's response. In some embodiments, the thickness 26, which may be measured from the top of an electrode to the top surface of the dielectric overcoat 24, may be less than approximately three or four times the thickness 36. In some embodiments, the thickness 26, as related to the thickness 36, may be in a range of approximately h_el<h_do<4*h_el. In some embodiments, the thickness 26 may be within a range from about twenty percent of a reference electrode period to about eighty percent of the reference electrode period. The reference electrode period may be any electrode period of a particular SAW device or may be otherwise based on the electrode period(s) of a SAW device, e.g., an average electrode period. Optionally, the thickness 26 may range between zero and seventy-five percent of an acoustic wavelength of a SAW excited on the surface of the substrate 12.

Figure 2:
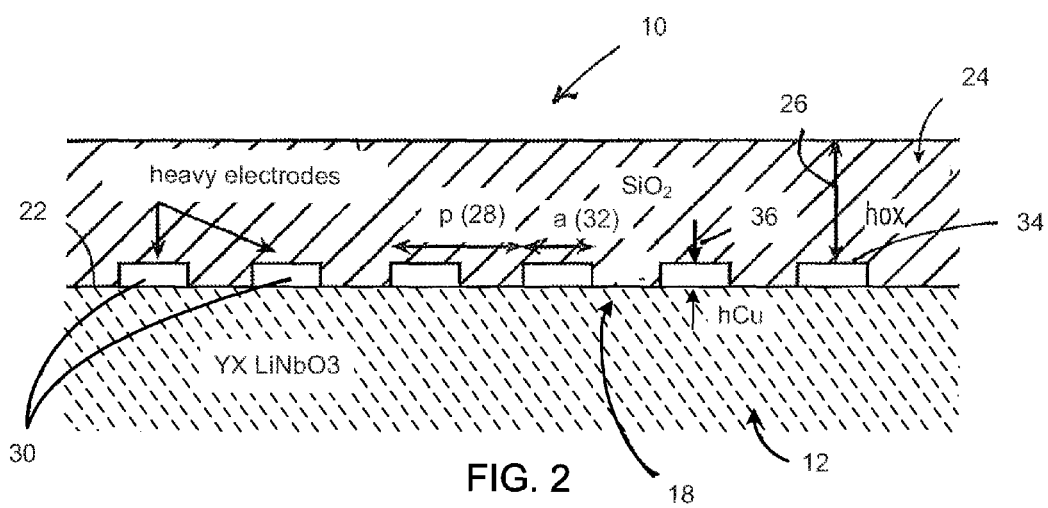
FIG. 2 diagrammatically illustrates Euler angles ($\lambda$, $\mu$, $\theta$) as herein defined.
Figure 2A:
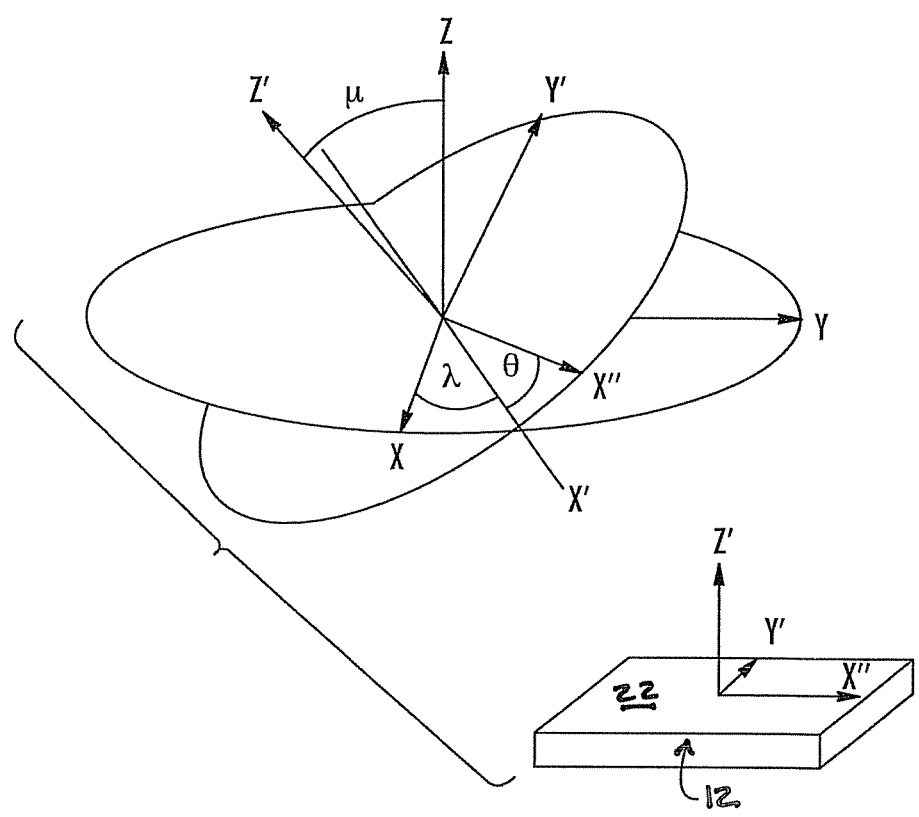

In various embodiments, the substrate 12 may have an electromechanical coupling factor that exceeds 5%, and may have an orientation defined by Euler angles (0±3 degrees, μ, 0±3 degrees), with angle μ=μ'−90, where μ' ranges from about 140 degrees to about 170 degrees. Euler angles (λ, μ, θ) are herein defined as above with further reference to FIG. 2.

The present embodiments are herein illustrated applying an analysis using finite element method/boundary element method (FEM/BEM) or finite element method/spectral domain analysis (FEM/SDA) to calculate the behavior of the desired and spurious modes on YX-LN substrates. In particular, the dependence of each mode's coupling and velocity has been estimated.

Figure 3:
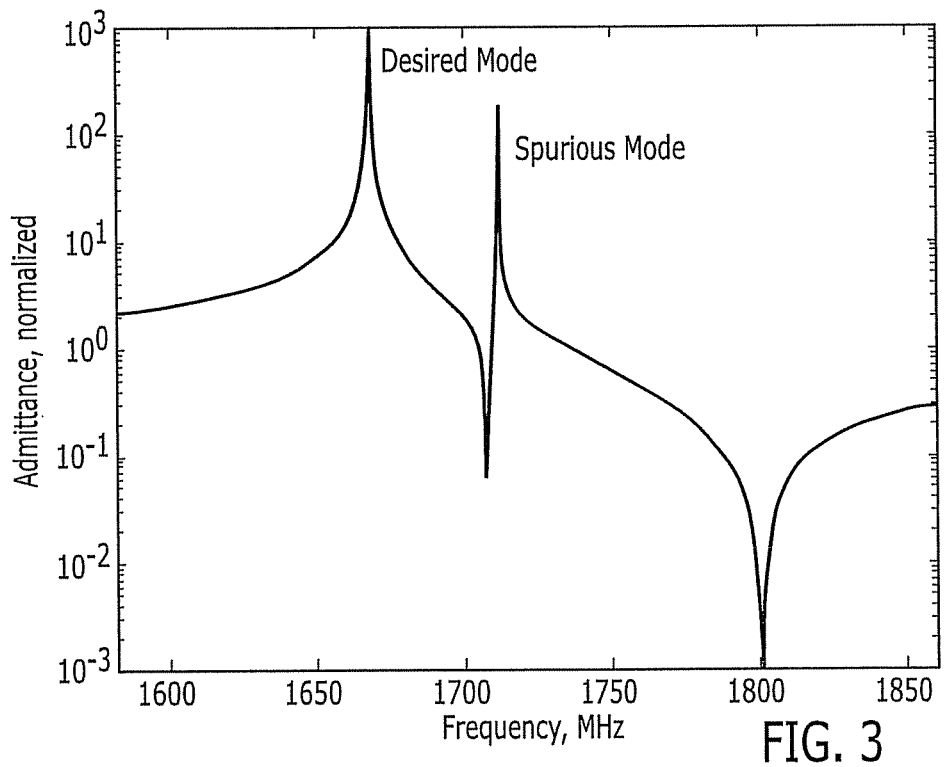
FIG. 3 is a graph that illustrates an admittance frequency response of a one port resonator including the response for both desired and spurious modes.
Figure 4:
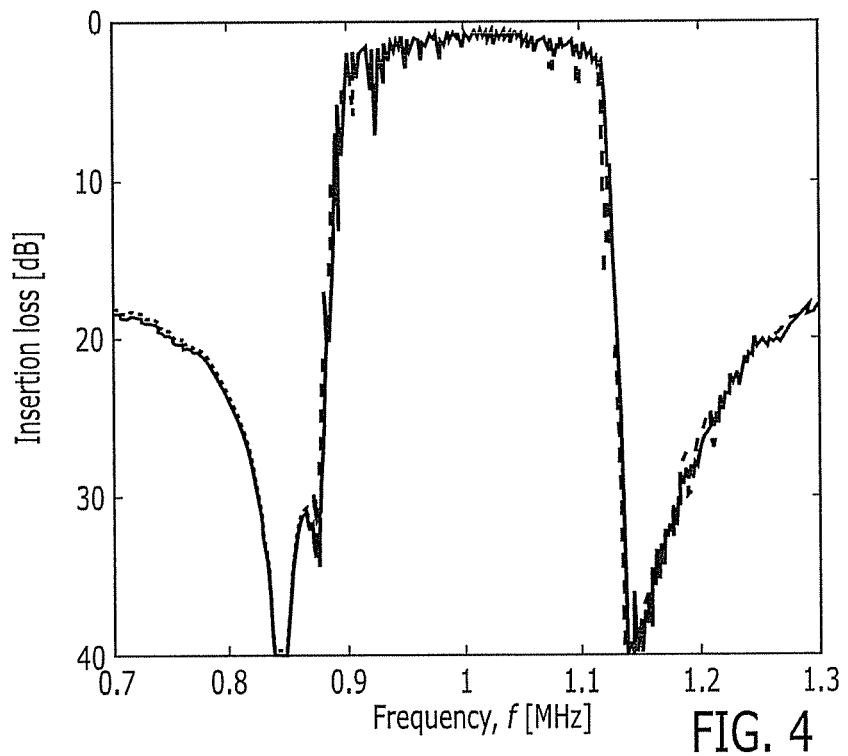
FIG. 4 is a graph that illustrates a passband for a pair of filters using one port resonators including responses of spurious modes.

Before examining experimental results from embodiments of the invention, consider typical results in the art, by way of example, with reference to the graph of FIG. 3 illustrating admittance as a function of frequency for a one-port resonator including the response of a spurious mode. Such a spurious mode can significantly degrade filter response. FIG. 4 is a graph that illustrates the response of a prior art filter. The notches in the passband of the filter result from the presence of the spurious mode. There is a need to overcome such spurious responses for application in commercial SAW filters.

The suppression of the spurious responses requires special attention. Some degree of suppression may be achieved by appropriate selection and combination of electrode thickness and dielectric overcoat thickness.

Figure 5:
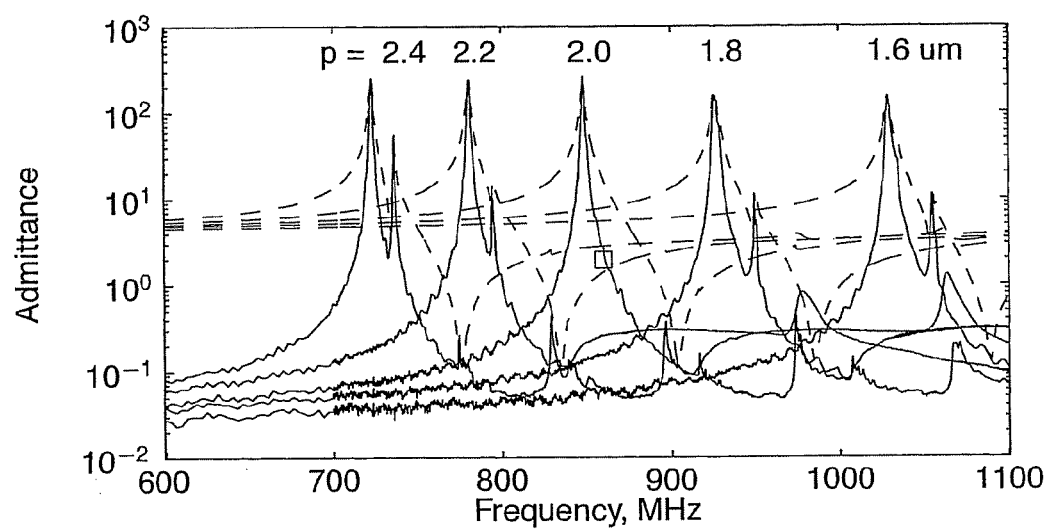
FIG. 5 is a graph that illustrates resonators with a ratio of electrode width (a) to electrode period (p) (hereinafter the ratio is also referred to as "duty factor") of 0.4 in accordance with some embodiments.
Figure 6:
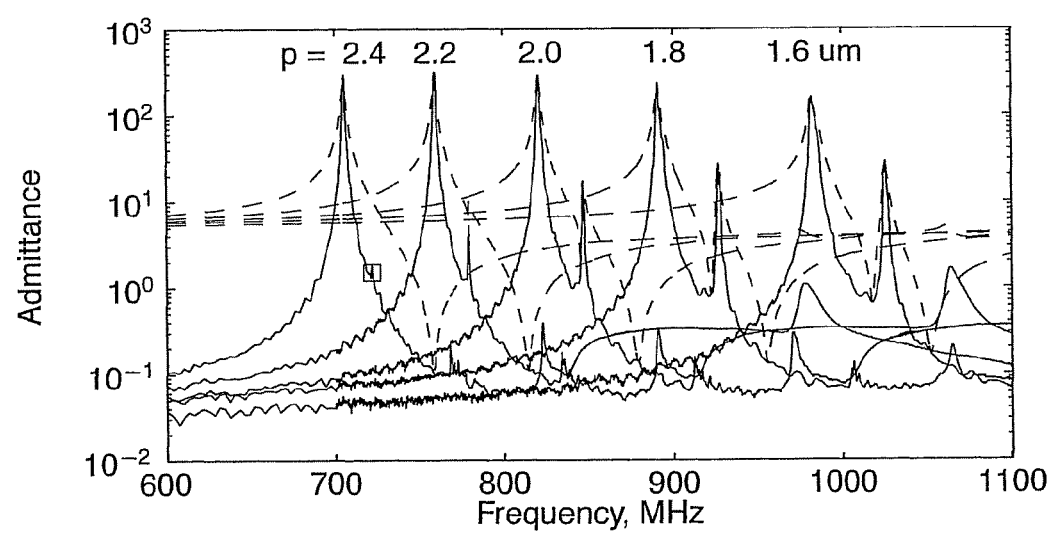
FIG. 6 is a graph that illustrates resonators with duty factors of 0.5 in accordance with some embodiments.

With reference now to FIGS. 5 and 6, graphs are shown to illustrate experimental measurements of the admittance of one-port resonators fabricated on a 150 degree YX-LN substrate, with the electrode gaps, e.g., spacing between electrodes, in the resonators being 1.2 μm in accordance with some embodiments. The resonators in FIG. 5 have a duty factor of 40% (a/p=0.4) and electrode periods of 1.6, 1.8, 2.0, 2.2, and 2.4 microns (μm). For a duty factor of 40% the spurious mode for the resonator with a period of 2.0 μm is well suppressed. The resonators in FIG. 6 have a duty factor of 50%, and the spurious mode for the resonator with a period of 2.4 μm is well suppressed. The results seen in FIGS. 5 and 6 demonstrate that the duty factor of resonators may, in this specific case, be modified in order to suppress the spurious responses in resonators. This detailed description will document under what conditions are required to achieve suppression of the spurious mode by varying the duty factor of the electrodes.

Figure 7:
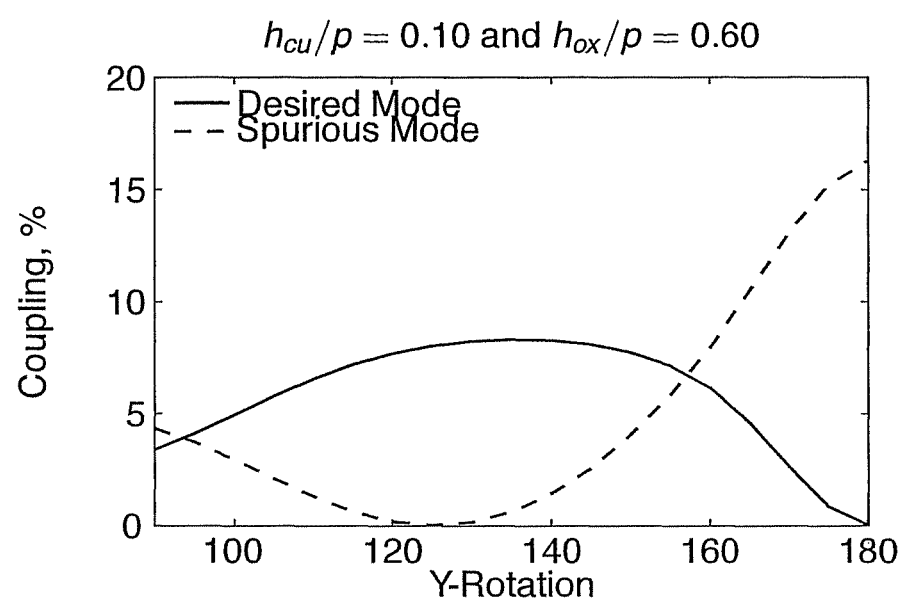
FIG. 7 is a graph that illustrates coupling coefficients for the desired mode and the spurious mode on a YX-LN substrate with electrode thickness (h_el) divided by period (p)

FIGS. 7 and 8 are graphs that illustrate the dependence of the coupling factors of the desired mode and spurious mode for a Y rotation of 90 to 180 degrees in accordance with some embodiments. The coupling factors for the desired and spurious modes are determined from the theoretical resonance and anti-resonant velocities, $v_R$ and $v_A$, for a device of infinite aperture and length.

$$K^2 = (0.5\pi v_R/v_A)/\tan(0.5\pi v_R/v_A) \quad (1)$$

When more than one mode is present, anti-resonant velocities of each mode depend upon the coupling strength of the other modes that are present. This produces an implied dependence of one mode's coupling on the other modes. So as to remove this dependence the admittance may be expressed as $$Y(f) = jwC(\Sigma R_n/(f - f_{R,n})) \quad (2)$$

$$f_A = f_R + R_n \quad (3)$$

$$v_R = f_R/(2 \cdot p) \quad (4)$$

$$v_A = f_A/(2 \cdot p) \quad (5)$$

Thus anti-resonant frequencies and velocities, equations (3) and (5), become effective representations, of what would be expected if the individual modes existed in the absence of the other modes. This effective representation of the coupling coefficients for the desired and spurious mode is useful in identifying attractive physical embodiments using FEM/BEM of FEM/SDA simulations.

FIG. 9 is a graph that illustrates a contour coupling coefficient of the spurious mode for a 127 degree YX-LN substrate in accordance with some embodiments. For FIG. 9, the contour of the spurious coupling coefficient is a function of both the electrode's thickness, h_el, and the thickness of the dielectric overcoat, h_do. The duty factor of the resonators represented in FIG. 9 is equal to 50% and does not vary. The dashed lines shown in FIG. 9 correspond to specific values for the ratio of overcoat thickness 26 to electrode thickness 36 (e.g., ratio of overcoat-to-electrode thickness). In the manufacture of SAW devices, it is convenient for the electrode and overcoat thicknesses to remain constant across the wafer. This implies that the ratio of overcoat-to-electrode thickness, h_do/h_el, may be constant for all resonators, e.g., resonators 14, 16, used to construct the SAW device 10. The ratios of h_do/h_el represented in FIG. 9 are 1, 2, 3, . . . , 7. In FIG. 9, minimum spurious mode coupling corresponds to ratios in the vicinity of h_do/h_el=3.

FIG. 10 is a graph that illustrates the coupling coefficient for the desired mode that accompanies the spurious mode illustrated in FIG. 9 in accordance with some embodiments.

In FIG. 10, dashed lines correspond to constant ratios of overcoat-to-electrode thickness; however, to eliminate the need for the dashed lines, the contours may be modified to present the coupling coefficients as functions of the electrode thickness, h_el, and the ratio of overcoat-to-electrode thickness, (h_do/h_el). FIGS. 11 and 12 provide graphs that represent the same information as seen in FIGS. 9 and 10, but represent the coupling coefficients as functions of electrode thickness and the ratio of overcoat-to-electrode thickness. In FIG. 11, negligible spurious content may exist to the lower right. The results in FIGS. 9, 10, and 11 represent resonators with duty factors of 50%.

To manufacture a SAW filter, it is desirable for the spurious mode to remain suppressed for a substantial range of electrode periods. FIGS. 9 and 11 indicate that for electrode thicknesses of h_el=0.1p to 0.3p and dielectric overcoat thicknesses of h_do=3 h_el, the spurious mode's coupling coefficient will likely remain below a value of 0.0001. This may be sufficient suppression for the manufacture of a SAW filter.

By modifying the Y-rotation of the lithium niobate substrate it may be possible to increase the coupling coefficient of the desired mode. FIGS. 13, 14, 15, and 16 are graphs that illustrate the performance metrics of resonators constructed on 150 degree YX LN with duty factors of 50% in accordance with some embodiments. The graphs of FIGS. 13 and 14 respectively illustrate the coupling coefficients of the spurious and desired modes. FIG. 13 includes a dashed curve which represents the location where the spurious mode's coupling coefficient is minimized. The graphs of FIGS. 15 and 16 illustrate a model for the temperature drift at resonance and anti-resonance for resonators on 150 degree YX-LN substrate with a duty factor of 50% in accordance with some embodiments.

Comparison of the spurious mode's coupling coefficient for 150 degree YX-LN substrate in FIG. 13 to that of 127 degree YX-LN in FIG. 11 reveals a problem. For FIG. 13, there is no substantial range of periods for which the spurious mode's coupling remains suppressed. As a result, the manufacture of a SAW filter with different electrode periods, having duty factors of 50%, may not be possible.

FIGS. 17 and 18 provide graphs that respectively represent the coupling coefficients of the spurious and desired modes for resonators on 150 degree YX-LN substrate with duty factors of 40% in accordance with some embodiments. The region of minimal spurious mode coupling for a duty factor of 40% is seen to shift as compared to that seen for a duty factor of 50% seen in FIGS. 13 and 14. This indicates that maintaining spurious mode suppression will be sensitive to duty factor, which will complicate the manufacture of devices. However, it also indicates that the spurious modes for resonators with differing periods may be suppressed by adjustment of the resonator's duty factors, which may enable the manufacture of devices with differing electrode periods to vary the duty factor in proportion with the electrode period to achieve desired objectives.

FIGS. 17-26 provide graphs that represent the coupling coefficients of the spurious and desired modes for resonators on 150 degree YX LN with duty factors ranging from 40%, 45%, 50%, 55% and 60% in accordance with some embodiments. For each duty factor there is a dashed line representing the location of minimal spurious mode coupling. Each of these lines is illustrated in FIG. 27. Using the results in FIG. 27 it is possible to prescribe a change in the duty factor as a function of electrode period such that the coupling to the spurious mode remains suppressed for a substantial range of electrode periods. If properly prescribed this will enable filters with an increased coupling to be manufactured while suppressing the spurious modes in each of the filter's resonators.

By choosing the electrode period corresponding to a duty factor of 50% as a reference, the vertical axis in FIG. 27 may be modified to represent a normalized electrode period. The result is illustrated in the graph of FIG. 28. FIG. 28 indicates that the prescribed duty factor needed to suppress the spurious mode may be estimated by a linear relationship. FIG. 29 is a graph that illustrates the prescribed relationship for 150 degree YX-LN substrate, and demonstrates that a variation of duty factor of 0.4 to 0.6 is sufficient to suppress the spurious mode in resonators with periods varying be more than +/−25% in accordance with some embodiments.

FIG. 30 is a graph that illustrates the prescribed relationship for spurious mode suppression on 140 degree YX-LN with a ratio of overcoat-to-electrode thickness of 2.0 in accordance with some embodiments. FIG. 31 is a graph that illustrates a contour for the level of spurious mode coupling predicted if the prescription in FIG. 30 is followed in accordance with some embodiments. Included in FIG. 31 is a bar indicating a +/−10% range of electrode period, which is a range sufficient for the manufacture of SAW filter. FIG. 32 is a graph that illustrates a desired mode's coupling coefficient in accordance with some embodiments. Comparing FIG. 32 to FIG. 12 indicates that a significant increase in the coupling coefficient for the desired mode may be achieved by prescribing the relationship between the duty factor and the period as described herein.

FIG. 33 is a graph that illustrates the prescribed duty factor for 140 degree YX-LN substrate with a ratio of overcoat-to-electrode thickness of 2.5 in accordance with some embodiments. FIGS. 34 and 35 are graphs that illustrate the coupling coefficients for the spurious and desired modes which result from the prescription in FIG. 33 in accordance with some embodiments.

Additional prescriptions and the resulting spurious and desired mode coupling coefficients are illustrated for various rotations of YX-LN substrates and overcoat-to-electrode thickness ratios in FIGS. 37-46 in accordance with some embodiments. As the Y rotation increases, larger values for the desired mode's coupling coefficient may be achieved.

Each of these prescriptions is characterized by a linear relationship having the form of $$a/p = a\_ref/p\_ref + m*(p/pref - 1) \quad (6)$$

where p_ref is value between a smallest electrode period, p_min, of a SAW device and a largest electrode period, p_max, of the SAW device, and a_ref/p_ref is a value between a_max/p_max and a_min/p_min, where a_max is a largest electrode width of the SAW device and a_min is a smallest electrode width of the SAW device.

The variable defining the prescribed slope, m, may be dependent upon the Y rotation of the YX-LN substrate and the ratio of the overcoat-to-electrode thickness. The dependence of the prescribed slope on the Y rotation and ratio of overcoat-to-electrode thicknesses is illustrated in the graph of FIG. 48. The prescribed slope may be between approximately 0.4 and 1.0.

The nominal electrode thicknesses for the prescribed embodiment are illustrated in FIG. 49. The prescribed electrode thicknesses may be in the range of approximately 0.1*p_ref<h_el<0.4*p_ref.

Unlike the prior art, the electrode widths are prescribed to functionally depend upon the period of the electrode. This prescription provides the utility of allowing SAW filters to be manufactured with large coupling coefficients and low temperature drift.

FIGS. 50, 51, and 52 provide graphs that illustrate the coupling coefficient and temperature drift at resonance and anti-resonance for resonators manufactured using the prescribed relationship between the electrode period and the duty factor. Significant improvement as compared to resonators one a 127 degree YX-LN substrate manufactured without using the prescribed relationship is evident. To illustrate the value of these embodiments, heavy copper electrodes with a planar SiOx dielectric overcoat have been used. However, the composition of the electrodes need not be copper. Any heavy metal or conductive material consistent with the teachings of the invention may be used, and are intended to be covered. While mention has been made to Y-rotations from 140 to 170 degree YX-LN substrates, this invention may also have utility for other YX-LN substrates. 170 and 180 YX-LN substrates are particularly attractive due to their high coupling coefficient. See, for example, FIG. 8. Non-planar SiOx dielectric overcoats are also intended to be included in embodiments of the invention. The dielectric overcoats may also include additional dielectric layers. For example, a silicon nitride layer may be deposited on top of the SiOx layer and trimmed in thickness to provide for accurate frequency adjustment. As a second example, a layer of aluminum nitride may be deposited on top of other layers to trap the wave beneath the aluminum nitride layer, such that a boundary (or interface) wave is produced. The dielectric overcoats may also have their surface etched or patterned to provide for grooves, dots, voids, or other geometries and remain consistent with the disclosed preferred embodiments.

Many modifications and other embodiments of the invention will come to the mind of one skilled in the art having the benefit of the teachings presented in the foregoing descriptions and associated drawings. Therefore, it is understood that the invention is not to be limited to the specific embodiments disclosed, and that modifications and embodiments are intended to be included within the scope of the appended claims.

That which is claimed is:

1. A surface acoustic wave (SAW) device comprising:
   a substrate including lithium niobate (LiNbO3) and configured to provide a propagation of an acoustic wave;
   one or more resonators formed by a plurality of electrodes on a surface of the substrate, wherein the plurality of electrodes have individual widths and are arranged with a plurality of different electrode periods with each of the plurality of different electrode periods being associated with a respective ratio of electrode width to electrode period; and
   a dielectric overcoat disposed between and over the plurality of electrodes, wherein the ratio of the electrode width to the electrode period is provided by:
   a/p=a_ref/p_ref+m*(p/p_ref−1);
   where a is the electrode width, p is the electrode period, m is a slope value between approximately 0.4 and 1.0, p_ref is value between a smallest electrode period (p_min) of the SAW device and a largest electrode period (p_max) of the SAW device, and a_ref/p_ref is a value between a_max/p_max and a_min/p_min, where a_max is a largest electrode width of the SAW device and a_min is a smallest electrode width of the SAW device.

2. The SAW device of claim 1, wherein m is approximately 0.5.

3. The SAW device of claim 1, wherein the substrate has an electromechanical coupling factor that is greater than approximately five percent.

4. The SAW device of claim 1, wherein the dielectric overcoat comprises silicon oxide (SiOx) and has a positive temperature coefficient of frequency (TCF) and a thickness, measured from a top surface of the plurality of electrodes to a top surface of the dielectric overcoat, that is greater than a thickness of the plurality of electrodes.

5. The SAW device of claim 4, wherein the ratio of the electrode width to electrode period is further based on a ratio of the thickness of the dielectric overcoat to the thickness of the plurality of electrodes.

6. The SAW device of claim 4, wherein the thickness of the dielectric overcoat is less than approximately three times the thickness of the plurality of electrodes.

7. The SAW device of claim 4, wherein the thickness of the dielectric overcoat is within a range from about twenty percent of the electrode period to about eighty percent of the electrode period.

8. The SAW device of claim 1, wherein the plurality of different electrode periods includes at least three different electrode periods with each associated with a respective ratio of electrode width to period.

9. The SAW device of claim 1, wherein a mass of individual electrodes is primarily provided by copper included in the individual electrodes.

10. The SAW device of claim 1, wherein an individual electrode has a thickness within a range from about ten to forty percent of a period associated with the individual electrode.

11. The SAW device of claim 1, wherein the substrate is configured to provide a propagation of a non-leaky acoustic wave and has an orientation defined by Euler angles (λ±3 degrees, μ, θ±3 degrees), with angle μ=μ'−90 degrees, where μ' is a Y rotation of the substrate and ranges from about 130 degrees to about 170 degrees.

12. The SAW device of claim 1, wherein the ratios of electrode width to electrode periods are between approximately forty percent and sixty percent.

13. A surface acoustic wave (SAW) device comprising:
   a substrate including lithium niobate (LiNbO3) and configured to provide a propagation of an acoustic wave;
   a first resonator including a first plurality of electrodes having widths (a1) and being arranged in a first pattern that includes a first electrode period (p1);
   a second resonator including a second plurality of electrodes having widths (a2) and arranged in a second pattern that includes a second electrode period (p2), wherein p1<p2, and (p1−a1)/p1>(p2−a2)/p2.

14. The SAW device of claim 13, further comprising:
   a dielectric overcoat disposed between and over the first and second plurality of electrodes and including silicon oxide (SiOx), a positive temperature coefficient of frequency (TCF), and a thickness, measured from a top surface of the first and second plurality of electrodes to a top surface of the dielectric overcoat, that is greater than a thickness of the first and second plurality of electrodes.

15. The SAW device of claim 14, wherein the thickness of the dielectric overcoat is less than approximately three times the thickness of the first and second plurality of electrodes.

16. The SAW device of claim 14, wherein the thickness of the dielectric overcoat is within a range from about twenty percent of a reference electrode period to about eighty percent of a reference electrode period, wherein the reference electrode period is based on the first period or the second period.

* * * * *